United States Patent
Koshiishi

(10) Patent No.: US 12,050,234 B2
(45) Date of Patent: Jul. 30, 2024

(54) IC SOCKET INCLUDES A BASE PART WITH A CONTACT PIN AND A SHEET MEMBER FOR ELECTRICAL CONNECTION BETWEEN THE IC PACKAGE AND THE WIRING BOARD

(71) Applicant: Enplas Corporation, Saitama (JP)

(72) Inventor: Kazutaka Koshiishi, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 17/863,440

(22) Filed: Jul. 13, 2022

(65) Prior Publication Data

US 2024/0019459 A1    Jan. 18, 2024

(51) Int. Cl.
 *G01R 1/04*      (2006.01)
 *G01R 1/067*    (2006.01)

(52) U.S. Cl.
 CPC ......... *G01R 1/0433* (2013.01); *G01R 1/0416* (2013.01); *G01R 1/06722* (2013.01); *G01R 1/06733* (2013.01)

(58) Field of Classification Search
 CPC . G01R 1/0433; G01R 1/0416; G01R 1/06733
 See application file for complete search history.

(56) References Cited

U.S. PATENT DOCUMENTS

| 6,281,692 B1* | 8/2001 | Bodenweber ...... G01R 1/07378 324/755.05 |
| 2004/0046581 A1* | 3/2004 | Maekawa ............ G01R 1/0483 324/754.03 |
| 2014/0253163 A1 | 9/2014 | Suzuki et al. |

FOREIGN PATENT DOCUMENTS

| JP | H1022021 A | * | 1/1998 |
| JP | 2004138552 A | * | 5/2004 |
| JP | 2014-169887 | | 9/2014 |

OTHER PUBLICATIONS

Translation of JP-2004138552-A (Year: 2004).*
Translation of JPH1022021A (Year: 1998).*

* cited by examiner

*Primary Examiner* — Paresh Patel

(57) ABSTRACT

A socket is configured to electrically connect a first electric component including a first terminal and a second electric component including a second terminal that is different from the first terminal in arrangement, the socket including: a contact pin configured to electrically connect the first terminal and the second terminal; a base part where the contact pin is disposed; and a sheet member disposed to face a surface of the base part on a second electric component side, the sheet member including an upper electrode configured to make contact with the contact pin when in use, a lower electrode configured to make contact with the second terminal when in use, and a wiring configured to connect the upper electrode and the lower electrode disposed at different positions in plan view.

2 Claims, 15 Drawing Sheets

IC SOCKET INCLUDES A BASE PART WITH A CONTACT PIN AND A SHEET MEMBER FOR ELECTRICAL CONNECTION BETWEEN THE IC PACKAGE AND THE WIRING BOARD

FIELD AND BACKGROUND OF THE INVENTION

The present invention relates to a socket and an inspection socket.

An IC socket is known as a socket for electrically connecting an electric component such as an IC package containing an integrated circuit (IC) to an external electric component (for example, wiring board), for example. The IC socket is used for inspecting the electrical characteristics in shipping inspection of the IC package, for example.

The IC socket includes, in the base part, a contact pin for electrical connection between the IC package and the wiring board. The IC package is placed on the top surface side of the base part, and the wiring board is attached to the bottom surface side of the base part. The contact pin extends through the base part. The upper end of the contact pin is exposed from the top surface of the base part and electrically connected to the terminal of the IC package. The lower end of the contact pin is exposed from the bottom surface of the base part and electrically connected to the terminal of the wiring board (see, for example, PTL 1).

CITATION LIST

Patent Literature

PTL 1

Japanese Patent Application Laid-Open No. 2014-169887

SUMMARY OF THE INVENTION

In many cases, the arrangement of the terminal of the IC package (for example, the distance between terminals and the like) differs depending on products. Therefore, in IC sockets and wiring boards used for inspecting IC packages, the arrangement of the terminal of the wiring board and the contact pin of the IC socket should be the same as the arrangement of the terminal of the IC package. This has increased cost because both the IC socket and the wiring board have to be prepared for each product of the IC package. In view of this, there is a demand for a socket that can achieve electrical connection to an IC package differing from the wiring board in arrangement of the terminal without additionally preparing the wiring board, which is expensive compared with the IC socket.

An object of the present invention is to provide a socket and an inspection socket that can achieve electrical connection to an IC package differing from the wiring board in arrangement of the terminal.

A socket according to an embodiment of the present invention is configured to electrically connect a first electric component including a first terminal and a second electric component including a second terminal that is different from the first terminal in arrangement, the socket including: a contact pin configured to electrically connect the first terminal and the second terminal; a base part where the contact pin is disposed; and a sheet member disposed to face a surface of the base part on a second electric component side, the sheet member including an upper electrode configured to make contact with the contact pin when in use, a lower electrode configured to make contact with the second terminal when in use, and a wiring configured to connect the upper electrode and the lower electrode disposed at different positions in plan view.

An inspection socket according to an embodiment of the present invention is configured to inspect electrical characteristics of a first electric component, the inspection socket comprising the above-mentioned socket.

According to the embodiment of the present invention, it is possible to achieve electrical connection to an IC package differing from the wiring board in arrangement of the terminal.

DESCRIPTION OF SPECIFIC EMBODIMENTS OF THE INVENTION

An embodiment of the present invention is elaborated below with reference to the accompanying drawings.

The present embodiment describes an inspection socket for an inspection device for inspecting the electrical characteristics of an electric component as an example of a socket. With this inspection device, various tests are performed on an electric component as an inspection target. For example, it can examine whether the electric component properly operates in the same environment as the actual use condition of the electric component, or in an environment with a greater load than the actual environment, and the like.

In addition, the socket according to the present embodiment is an IC socket for IC packages as inspection targets, but the electric components as the inspection targets of the socket may be electric components different from IC packages. The IC is an electronic circuit, and includes a transistor, a resister, a capacitor and an inductor mutually connected on a silicon substrate, for example.

Figure 1:
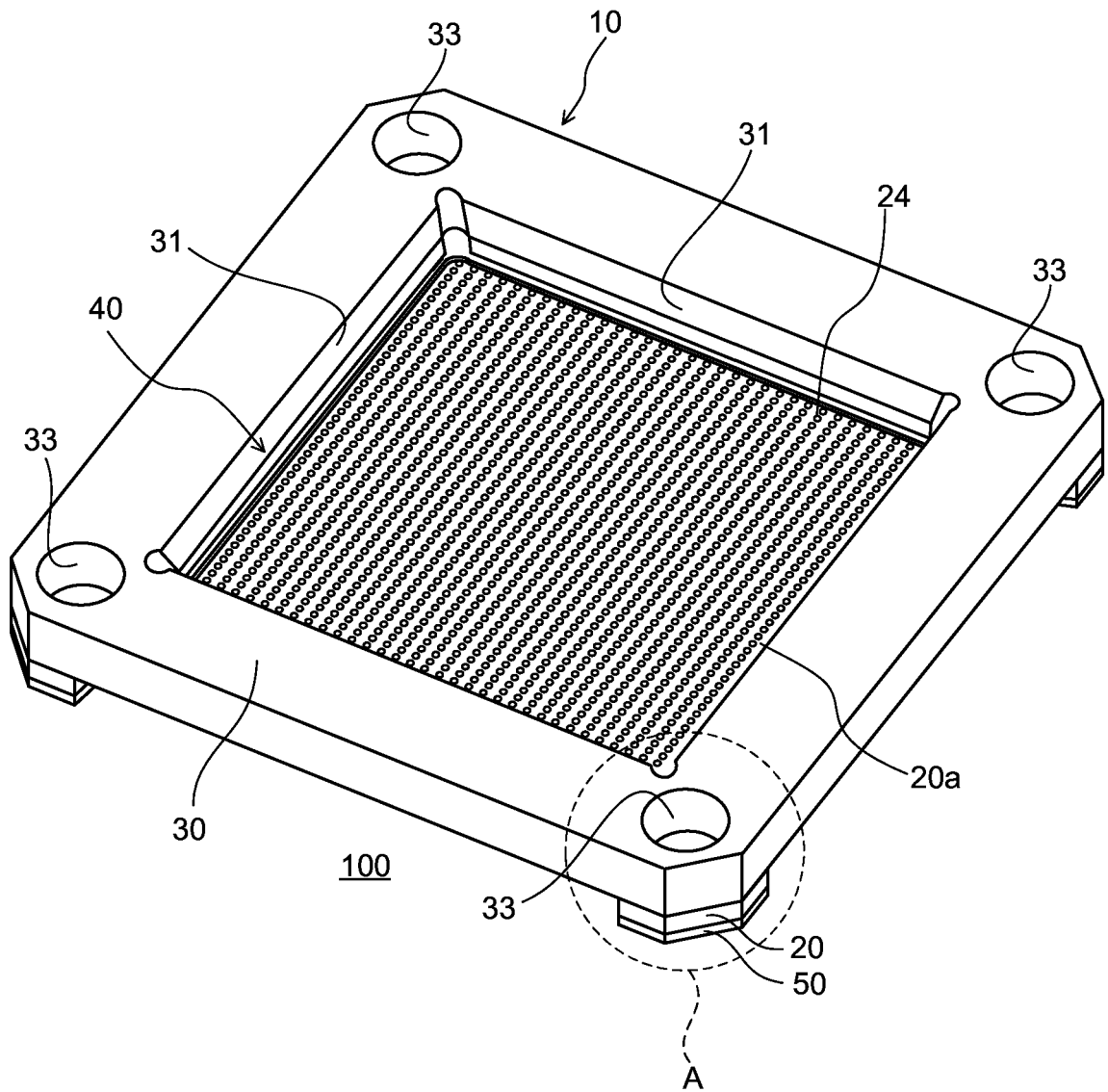
FIG. 1 is a perspective view illustrating a socket and a wiring board according to an embodiment of the present invention and illustrating a top surface side of the socket.
Figure 2:
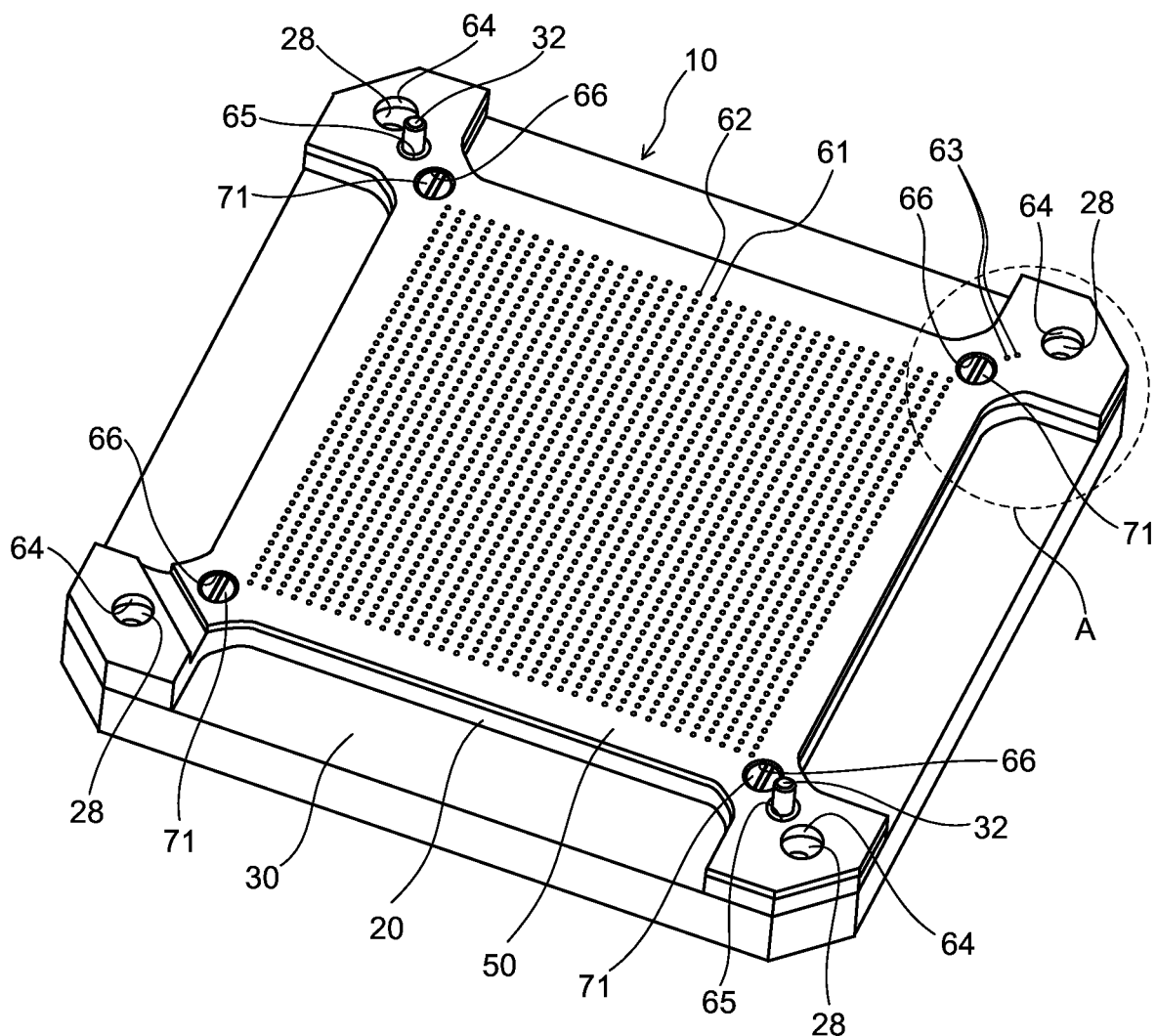
FIG. 2 is a perspective view illustrating a bottom surface side of the socket illustrated in FIG. 1.

FIG. 1 is a perspective view illustrating IC socket 10 and wiring board 100 according to the present embodiment, and illustrating a top surface side of IC socket 10. FIG. 2 is a perspective view illustrating a bottom surface side of IC socket 10 illustrated in FIG. 1. Note that FIG. 2 illustrates a state where wiring board 100 is dismounted from IC socket 10.

Figure 3:
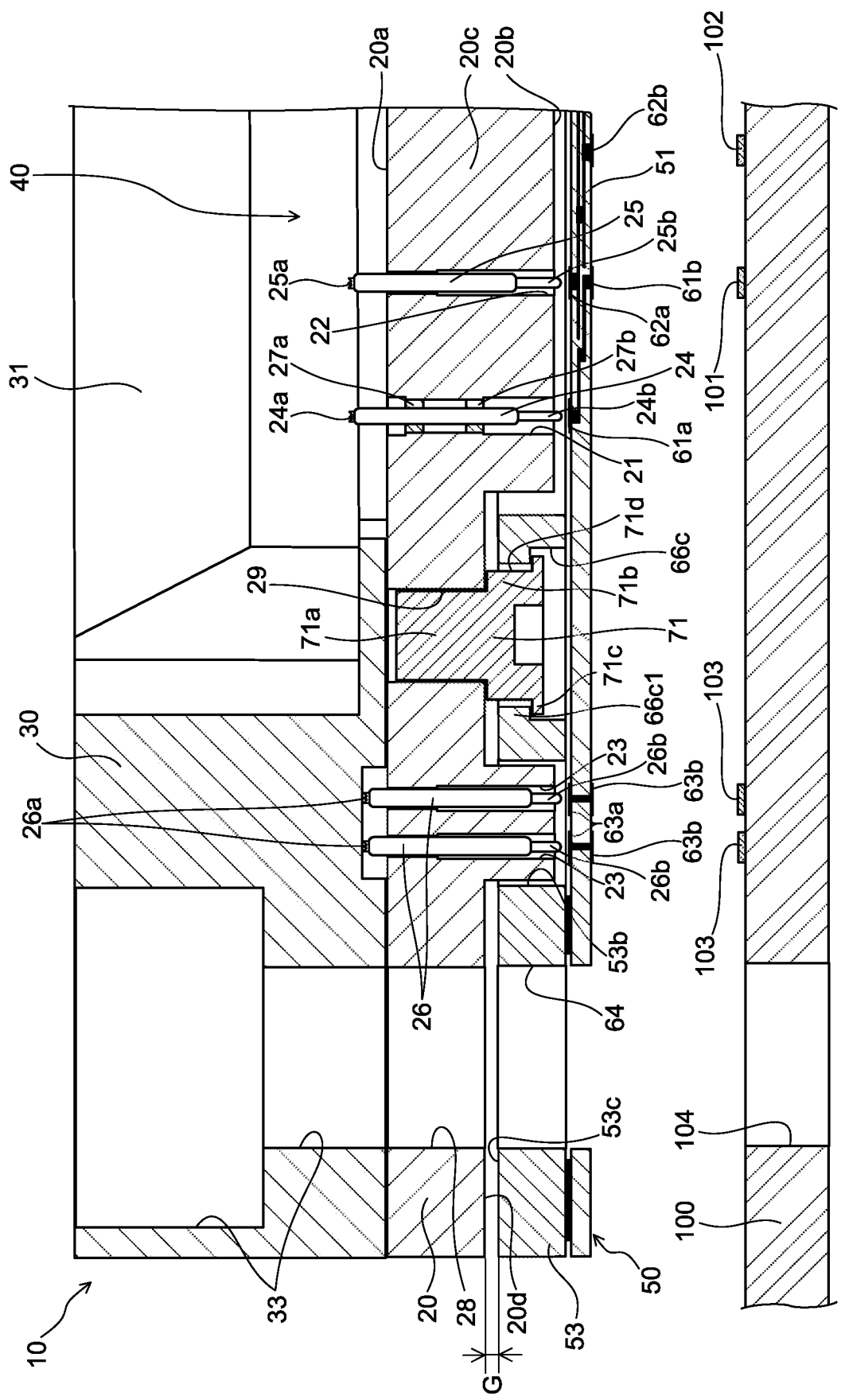
FIG. 3 is a sectional view of corner A of the socket illustrated in FIGS. 1 and 2 in a state before the wiring board is attached to the socket.
Figure 4:
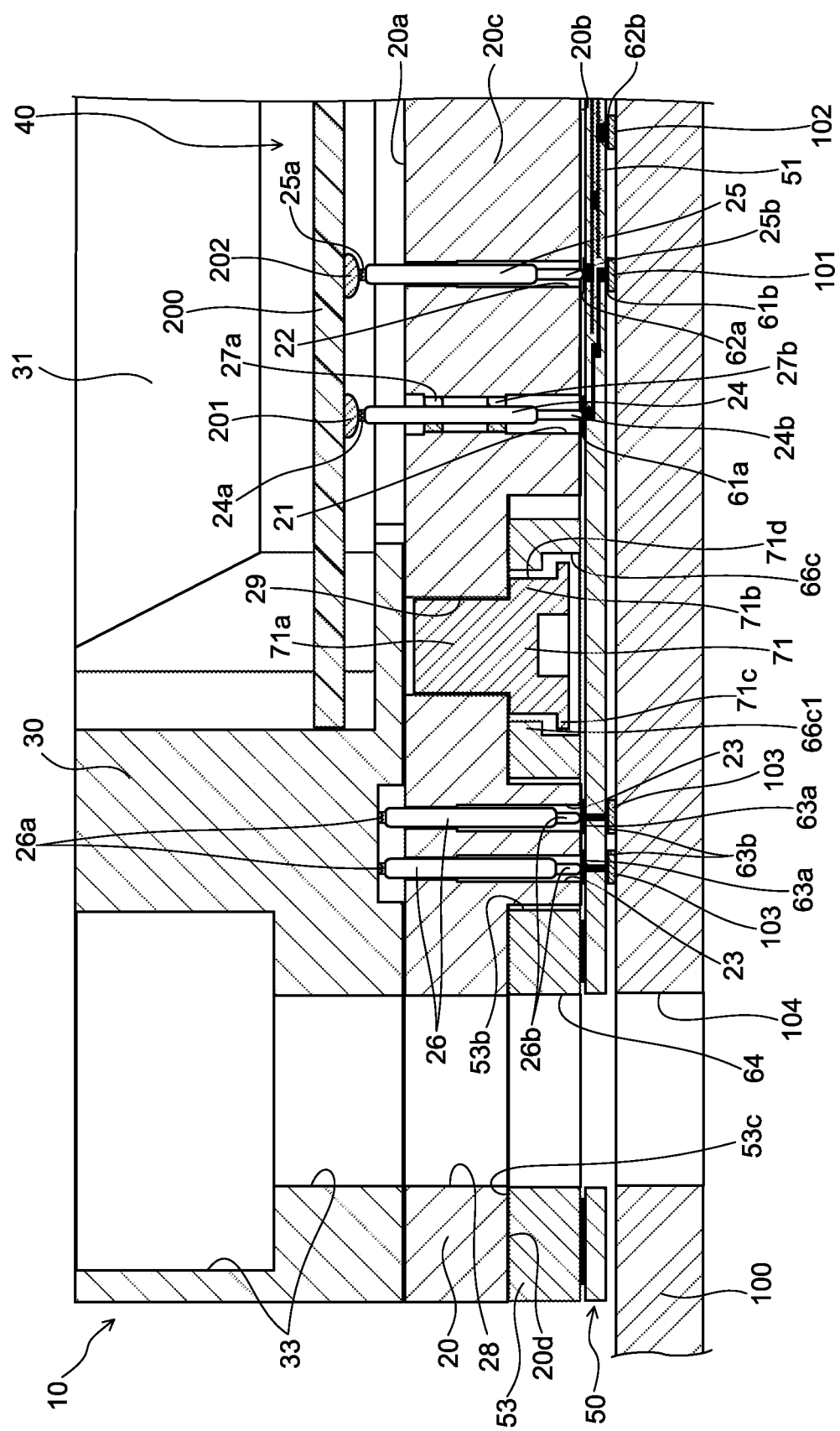
FIG. 4 is a sectional view of corner A of the socket illustrated in FIGS. 1 and 2 in a state where an IC package is housed in the socket after the wiring board is attached to the socket.

In addition, FIGS. 3 and 4 are sectional views at corner A of IC socket 10 illustrated in FIGS. 1 and 2. Specifically, FIG. 3 is a diagram illustrating a state before wiring board 100 is attached to IC socket 10, and FIG. 4 is a diagram illustrating a state where IC package 200 is housed in IC socket 10 after wiring board 100 is attached to IC socket 10.

IC Socket

IC socket 10 includes base part 20 where IC package 200 is placed, and frame part disposed outside top surface 20a of base part 20. The interior of frame part 30 is configured as housing part 40 for housing IC package 200.

Here, IC package 200 is an example of a first electric component of the present invention. In the present embodiment, a ball grid array (BGA) type IC package, a land grid array (LGA) type IC package and the like are applicable as IC package 200, for example. In addition, wiring board 100 is an example of a second electric component of the embodiment of the present invention. In the present embodiment, it is a wiring board of an inspection device for performing the above-described various tests.

Base Part

Base part 20 is a planar member with a predetermined thickness, and makes up the bottom of housing part 40, for example. Specifically, top surface 20a of base part 20 serves as the bottom surface of housing part 40. Note that in the present embodiment, the thickness direction of base part 20 is referred to as vertical direction, and "up" and "down" described hereafter are up and down in this vertical direction.

As illustrated in FIGS. 3 and 4, through holes 21, 22 and 23 extending through in the vertical direction between top surface 20a and bottom surface 20b of base part 20 are formed in base part 20. Contact pins 24, 25 and 26 are inserted (disposed) to through holes 21, 22 and 23, respectively.

Note that while FIGS. 3 and 4 illustrate one pair of through hole 21 and contact pin 24 and one pair of through hole 22 and contact pin 25, they are disposed in multiple pairs in base part 20 as illustrated in FIGS. 1 and 2. In addition, while FIGS. 2 to 4 illustrate two pairs of through hole 23 and contact pin 26, they may be provided in one pair, or three or more pairs.

In the present embodiment, as an example, contact pin 24 is configured as a coaxial line for transmitting a radio frequency signal. With such a configuration, base part 20 is formed of a conductive material, and contact pin 24 is held by through hole 21 through insulating members 27a and 27b. Insulating member 27a inserted to through hole 21 functions as a retainer, and is configured such that contact pin 24 is not removed upward from top surface 20a.

In addition, contact pin 25 is a ground contact pin for IC package 200 housed in housing part 40, and is directly held by through hole 22. Through hole 22 functions as a retainer, and is configured such that contact pin 25 is not removed upward from top surface 20a.

In addition, contact pin 26 is a ground contact pin for frame part 30, and is directly held by through hole 23. Through hole 23 also functions as a retainer, and configured such that contact pin 26 is not removed upward from top surface 20a.

Note that the present embodiment is applicable not only to contact pin 24, but also to other contact pins. In such cases, for example, base part 20 is formed of an insulating material, and contact pin 24 is directly held by through hole 21 as with contact pins 25 and 26.

In addition, base part 20 is provided with fastening hole 28 extending through in the vertical direction. When base part 20, frame part 30, supporting part 50 and wiring board 100 are aligned and assembled, fastening hole 28 is disposed to form a single fastening hole together with fastening hole 33 of frame part 30 described later, fastening hole 64 of supporting part 50 and fastening hole 104 of wiring board 100. As such, fastening holes 28, 33, 64 and 104 are formed such that their number and positions match. Wiring board 100 is fastened to IC socket 10 (base part 20, frame part 30 and supporting part 50) by inserting a bolt to fastening holes 28, 33, 64 and 104 and fastening it with a nut, for example.

In addition, although not illustrated in the drawing, base part 20 is provided with a positioning hole extending through in the vertical direction. When base part 20, frame part 30, supporting part 50 and wiring board 100 are aligned and assembled, the positioning hole of base part 20 is disposed to form a single positioning hole together with positioning hole 65 of supporting part 50 and the positioning hole (omitted in the drawing) of wiring board 100. As such, these positioning holes are formed such that their number and positions match. With positioning pin 32 of frame part 30 described later inserted to these positioning holes, the alignment of contact pin 24 and terminals 101 to 103 (a second terminal in the present invention) of wiring board 100 are achieved.

In addition, base part 20 is provided with screw fixing hole 29 that extends along the vertical direction and to which guide member 71 described later is screw fixed. In the present embodiment, screw fixing hole 29 extends through base part 20 as an example, but screw fixing hole 29 may not extend through base part 20 as long as guide member 71 can guide supporting part 50 in the vertical direction.

In addition, in base part 20, the vertical thickness of outer part 20d is smaller than that of center portion 20c where contact pin 24 is disposed. The reason for this is to ensure a large vertical thickness of holding member 53 for holding sheet member 51 described later. With the large vertical thickness of holding member 53, the strength of holding member 53 can be ensured.

In addition, while guide member 71 is provided and holding member 53 is disposed in base part 20 in the present embodiment, holding member 53 may be integrated with base part 20. When holding member 53 and base part 20 are integrated with each other, the bottom surface of holding member 53 may serve as bottom surface 20b of base part 20.

Frame Part

Frame part 30 is a frame body with its center portion opening to the vertical direction and surrounded. Frame part 30 makes up the outer periphery part of housing part 40. While the opening portion has a rectangular shape as an example in the present embodiment, it may be appropriately changed in accordance with the shape of IC package 200 to be housed.

Guide part 31 that guides IC package 200 to a correct position in housing part 40 is provided on the inner periphery side of frame part 30, i.e., at the inner wall of housing part 40. Publicly known techniques are applicable for guide part 31 that guides IC package 200 to a correct position of housing part 40, and therefore the description thereof is omitted.

IC package 200 guided by guide part 31 to a correct position in housing part 40 and housed in housing part 40 is pressed by a pressing member omitted in the drawing and the like. With this pressure, terminals 201 and 202 (a first terminal in the present invention) such as a solder ball of IC package 200 make pressure contact with upper contact end portions 24a and 25a of contact pins 24 and 25 described later. Then, terminals 201 and 202 of IC package 200 form reliable electrical connection with terminals 101 and 102 of wiring board 100 described later through contact pins 24 and 25 and first wiring 61 and second wiring 62 of sheet member 51. That is, during the use, IC socket 10 houses IC package 200 in housing part 40 and electrically connects the housed IC package 200 (terminals 201 and 202) and wiring board 100 (terminals 101 and 102) attached on the loser side of base part 20.

In addition, frame part 30 is provided with a plurality of positioning pins 32 protruding downward from different positions of the bottom surface of frame part 30 for the alignment of contact pins 24 and 25, first wiring 61 and second wiring 62 of sheet member 51 and terminals 101 and 102 of wiring board 100. While positioning pins 32 are diagonally provided at two locations in frame part 30 as illustrated in FIG. 2 in the present embodiment, the number and position may be appropriately changed as long as a plurality of positioning pins 32 are provided. Positioning pin 32 is inserted to the positioning hole of base part 20 and positioning hole 65 of supporting part 50 and inserted to the positioning hole of wiring board 100.

In addition, frame part 30 is provided with fastening hole 33 extending through in the vertical direction. While fastening holes 33 are provided at four corners in frame part as illustrated in FIG. 1 in the present embodiment, the number and positions of fastening holes 33 may be appropriately changed.

Note that while base part 20 and frame part 30 making up housing part 40 are separate members in the present embodiment, base part 20 and frame part 30 may be formed integrally with each other. In short, housing part 40 need only be configured to be able to house IC package 200.

Contact Pin

Contact pins 24 and 25 are conductive pins formed of a conductive material. As described above, contact pins 24 and 25 are inserted and held in through holes 21 and 22 formed in base part 20, and provided to extend through base part 20 in the vertical direction.

Upper contact end portions 24a and 25a (pin upper ends in the present invention), which are contact end portions on the upper side of contact pins 24 and 25, are exposed upward from top surface 20a of base part 20 as illustrated in FIG. 3. In addition, lower contact end portions 24b and 25b (pin lower ends in the present invention), which are contact end portions on the lower side of contact pins 24 and 25, are exposed downward from bottom surface 20b of base part 20 as illustrated in FIG. 3.

When IC socket 10 is being used, as illustrated in FIG. 4, upper contact end portions 24a and 25a of contact pins 24 and 25 make contact with terminals 201 and 202 of IC package 200. In addition, lower contact end portions 24b and 25b of contact pins 24 and 25 make contact with first wiring 61 and second wiring 62 of sheet member 51. In this manner, IC package 200 and wiring board 100 separated from each other in the vertical direction with base part 20 interposed therebetween are electrically connected with each other through sheet member 51.

In addition, contact pin 26 is also a conductive pin formed of a conductive material. As described above, contact pin 26 is inserted and held in through hole 23 formed in base part 20, and provided to extend through base part 20 in the vertical direction.

Upper contact end portion 26a, which is a contact end portion on the upper side of contact pin 26 is exposed upward from top surface 20a of base part 20 and makes contact with frame part 30 as illustrated in FIGS. 3 and 4. When IC socket 10 is being used, lower contact end portion 26b, which is a contact end portion on the lower side of contact pin 26, makes contact with third wiring 63 of sheet member 51 described later as illustrated in FIG. 4. In this manner, frame part 30 and wiring board 100 separated from each other in the vertical direction with base part 20 interposed therebetween are electrically connected with each other through sheet member 51.

As the configuration of contact pins 24 to 26, for example, it is possible to adopt a configuration including a cylindrical member (barrel), end portions (plunger) protruded from upper and lower openings of the cylindrical member, a spring housed in the cylindrical member and configured to apply the pressure force of the protruding direction to the end portion, and the like. Publicly known techniques are applicable for the configuration of contact pins 24 to 26, and therefore the description thereof is omitted.

Note that in the case where radio frequency signals are transmitted between IC package 200 and wiring board 100, it is desirable to configure contact pin 24 as a coaxial line and set the length of contact pin 24 to a small value in order to match the characteristic impedance.

Contact pins 24 and 25 are provided in a manner corresponding to the configuration of package 200 of the inspection target IC. Contact pins 24 and 25 are provided in a manner corresponding to the configurations (number, positions and the like) of terminals of IC package 200, and contact pin 24 includes a power source supply contact pin, a signal transmission contact pin, and the like, for example.

Supporting Part

As elaborated later, supporting part 50 includes sheet member 51 and the like. With first wiring 61 and second wiring 62 described later, sheet member 51 enables electrical connection to IC package 200 differing from wiring board 100 in arrangement of the terminal. In addition, sheet member 51 covers lower contact end portions 24b to 26b exposed downward from bottom surface 20b of base part 20, and prevents wiring board 100 from damaging lower contact end portions 24b to 26b when attaching wiring board 100 to the bottom surface of base part 20.

Sheet member 51 includes first wiring 61, second wiring 62 and third wiring 63. Sheet member 51 is supported by base part 20 in the state where it faces bottom surface 20b, which is a surface of base part 20 on the wiring board 100 side, and is configured to be movable in the vertical direction with the guide of guide member 71 described later.

Figure 5:
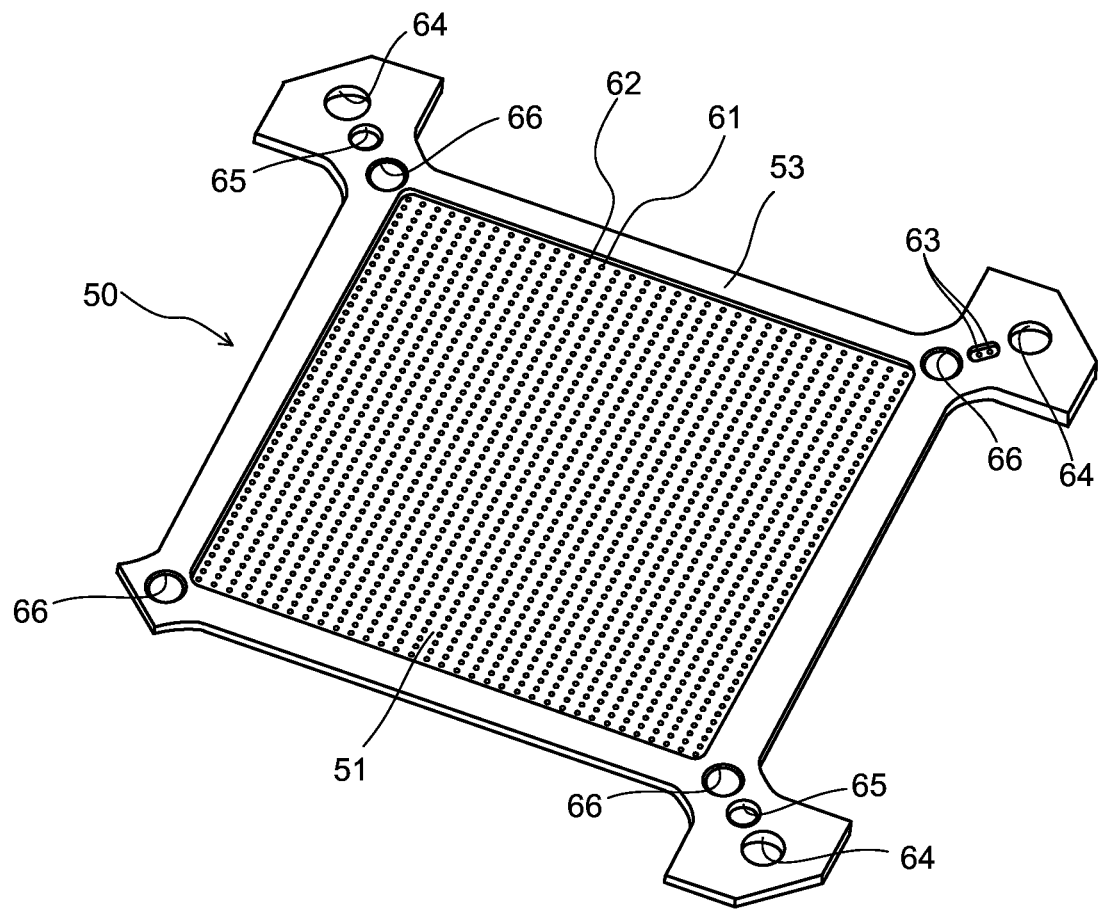
FIG. 5 is a perspective view illustrating a top surface side of a supporting part disposed on the bottom surface side of the socket illustrated in FIG. 2.
Figure 6:
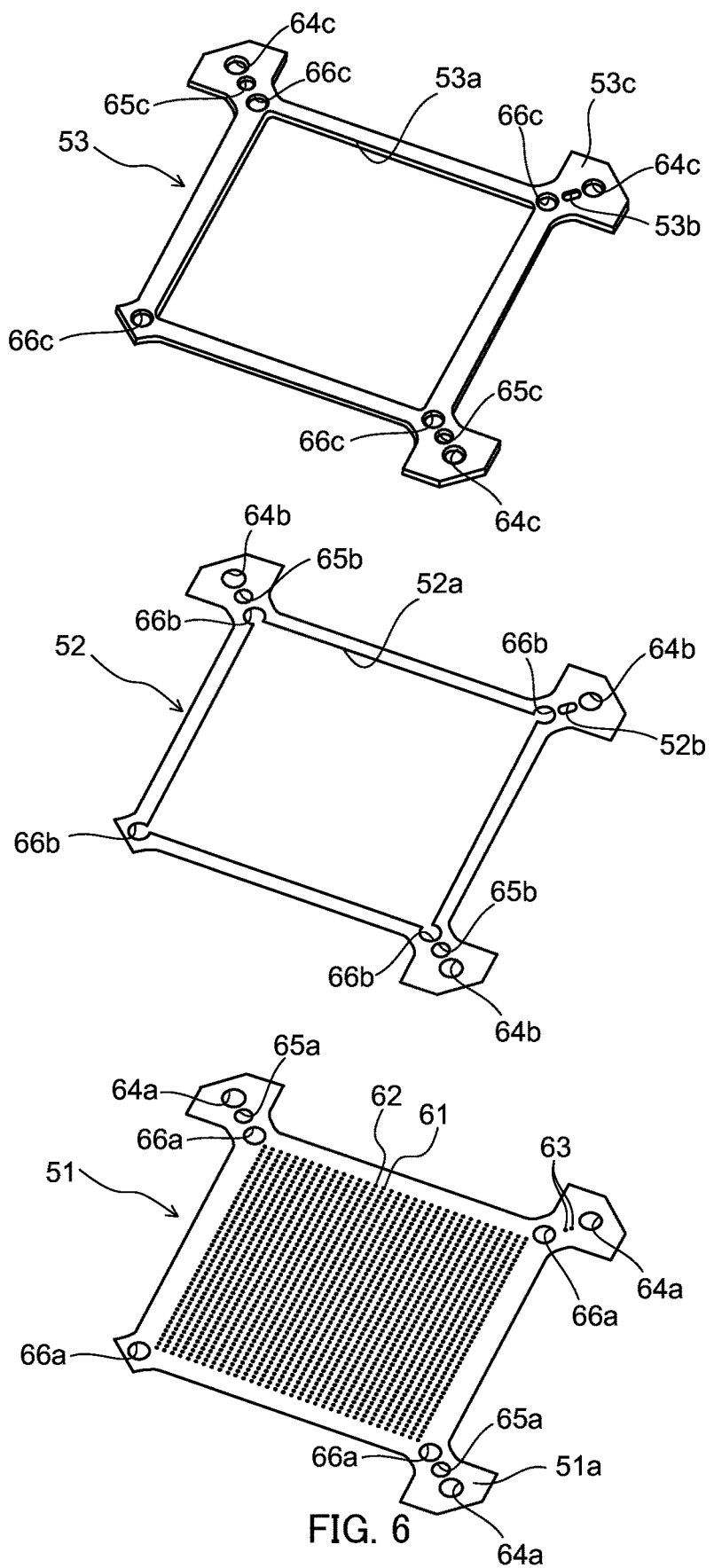
FIG. 6 is a perspective view illustrating a sheet member, a bonding member and a holding member making up the supporting part illustrated in FIG. 5.
Figure 7A:
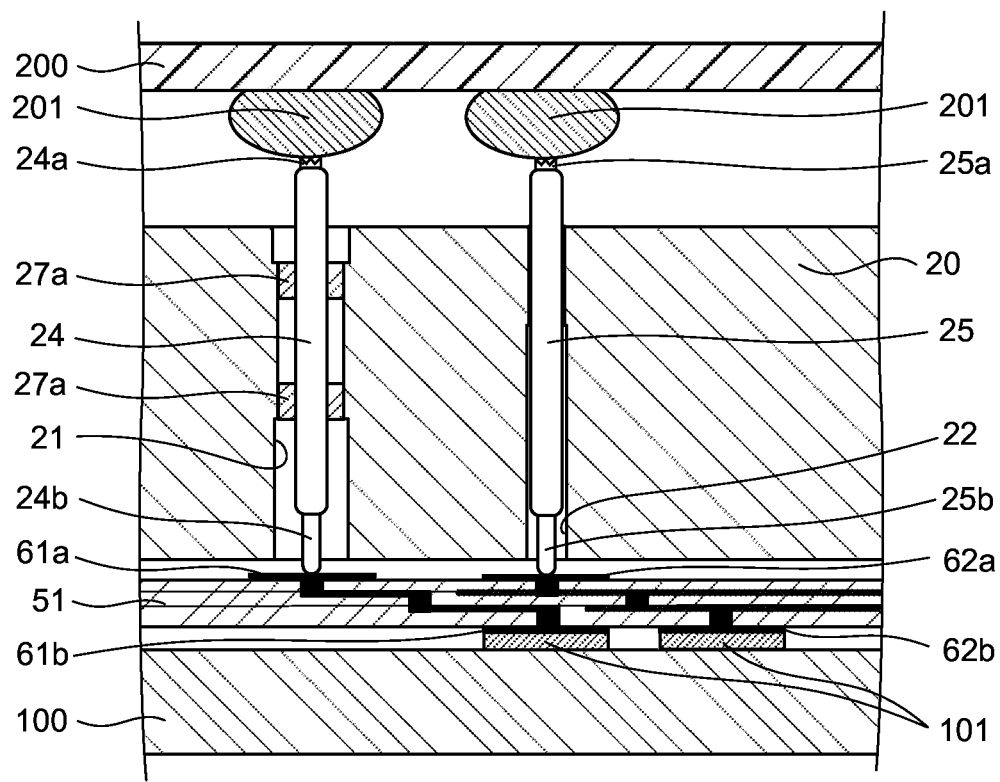
FIG. 7A is a sectional view for describing a configuration of pressing the sheet member.
Figure 7B:
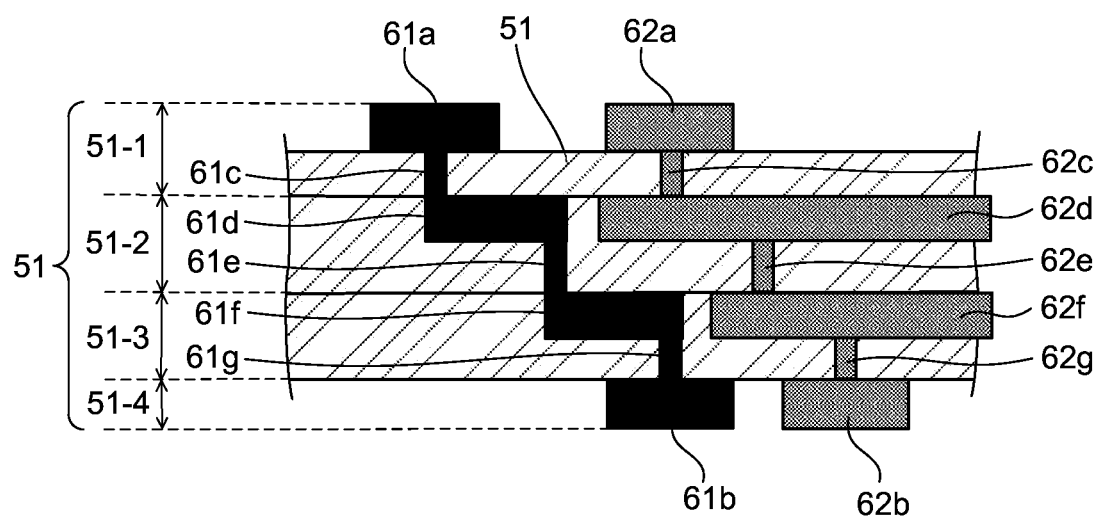
FIG. 7B is a sectional view illustrating the sheet member illustrated in FIG. 7A in an enlarged manner.

First, supporting part 50 provided with sheet member 51 is described with reference to FIGS. 3 to 7B. FIG. 5 is a perspective view illustrating a top surface side of supporting part 50 disposed on the bottom surface side of IC socket 10 of is illustrated in FIG. 2. FIG. 6 is a perspective view illustrating sheet member 51, bonding member 52 and holding member 53 making up supporting part 50 illustrated in FIG. 5. FIG. 7A is a sectional view for describing a configuration of pressing sheet member 51, and FIG. 7B is a plan view illustrating sheet member 51 illustrated in FIG. 7A in an enlarged manner.

As illustrated in FIG. 6, supporting part 50 includes sheet member 51, bonding member 52, and holding member 53.

Sheet Member

As illustrated in FIGS. 3 and 4, sheet member 51 is supported by base part 20 in the state where it faces bottom surface 20b, and is configured to be movable in the vertical direction with the guide of guide member 71. Further, when wiring board 100 is attached to IC socket 10, i.e., when IC socket 10 is used, sheet member 51 is pushed up by wiring board 100.

Sheet member 51 is provided with first wiring 61, second wiring 62 and third wiring 63 extending through in the vertical direction.

In the present embodiment, terminals 101 and 102 of wiring board 100 are two-dimensionally arrayed, and in addition, terminals 201 and 202 of IC package 200 are also two-dimensionally arrayed. Further, the arrangement of terminals 101 and 102 of wiring board 100 and the arrangement of terminals 201 and 202 of IC package 200 are different from each other, and first wiring 61 and second wiring 62 are configured to connect the electric components differing in arrangement of the terminal.

Specifically, first wiring 61 includes upper electrode 61a, lower electrode 61b, interlayer vias 61c, 61e and 61g, and wirings 61d and 61f. Interlayer via 61c connects upper electrode 61a and wiring 61d, and interlayer via 61e connects wiring 61d and wiring 61f, and interlayer via 61g connects wiring 61f and lower electrode 61b. In this manner, upper electrode 61a and lower electrode 61b are connected in a manner extending through sheet member 51 in the vertical direction (thickness direction). Wirings 61d and 61f are configured to extend in the direction (the plane direction of sheet member 51) that intersects the vertical direction from upper electrode 61a to lower electrode 61b. In this manner, upper electrode 61a and lower electrode 61b disposed at different positions (respective offset positions) in plan view are connected.

Note that in plan view, interlayer via 61e may be disposed at a position overlapping upper electrode 61a or lower electrode 61b. With such an arrangement, one of wiring 61d and wiring 61f may not be provided.

Second wiring 62 includes upper electrode 62a, lower electrode 62b, interlayer vias 62c, 62e and 62g, and ground layers 62d and 62f. Interlayer via 62c connects upper electrode 62a and ground layer 62d, interlayer via 62e connects ground layer 62d and ground layer 62f, and interlayer via 62g connects ground layer 62f and lower electrode 62b. In this manner, upper electrode 62a and lower electrode 62b are connected in a manner extending through sheet member 51 in the vertical direction. Ground layers 62d and 62f are configured to extend at least in the direction (the plane direction of sheet member 51) that intersects the vertical direction from upper electrode 62a to lower electrode 62b. In this manner, upper electrode 62a and lower electrode 62b disposed at different positions (respective offset positions) in plan view are connected to each other.

Figure 8:
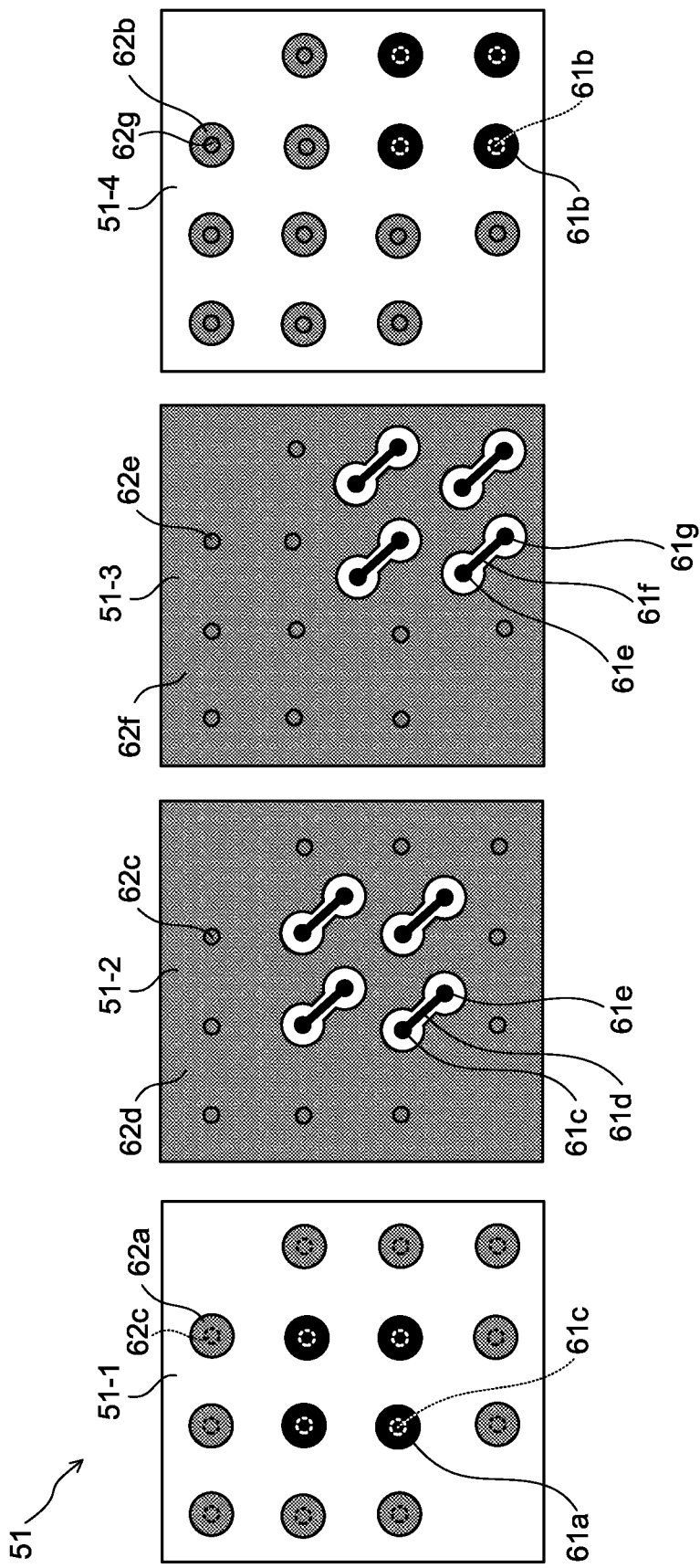
FIG. 8 is a plan view for describing a 4-layer substrate making up the sheet member.

Note that in the case where wirings 61d and 61f are configured to be microstrip lines, it suffices to extend ground layers 62d and 62f in the plane direction of sheet member 51 while avoiding wirings 61d and 61f and interlayer vias 61c, 61e and 61g as illustrated in FIG. 8 described later.

Third wiring 63 includes upper electrode 63a, lower electrode 63b, and a penetration via (whose reference numeral is omitted). At third wiring 63, the penetration via extending through sheet member 51 in the vertical direction connects upper electrode 63a and lower electrode 63b. Here, in third wiring 63, upper electrode 63a and lower electrode 63b are not disposed at respective offset positions unlike first wiring 61 and second wiring 62. However, as in first wiring 61 and second wiring 62, upper electrode 63a and lower electrode 63b may be disposed at respective offset positions.

At first wiring 61, upper electrode 61a makes contact with lower contact end portion 24b of contact pin 24, and lower electrode 61b makes contact with terminal 101 of wiring board 100, thus electrically connecting contact pin 24 and terminal 101. Likewise, at second wiring 62, upper electrode 62a makes contact with lower contact end portion 25b of contact pin 25, and lower electrode 62b makes contact with terminal 102 of wiring board 100, thus electrically connecting contact pin 25 and terminal 102.

With such first wiring 61 and second wiring 62, terminals 101 and 102 (contact pins 24 and 25) of wiring board 100 and terminals 201 and 202 of IC package 200, which are different from each other in arrangement, are connected.

In addition, at third wiring 63, upper electrode 63a makes contact with lower contact end portion 26b of contact pin 26, and lower electrode 63b makes contact with terminal 103 of wiring board 100, thus electrically connecting contact pin 26 and terminal 103.

In addition, when attaching wiring board 100 to IC socket 10, terminals 101 to 103 of wiring board 100 do not make direct contact with lower contact end portions 24b to 26b of contact pins 24 to 26 whose lower side is covered with sheet member 51. Thus, when aligning base part 20 and wiring board 100, lower contact end portions 24b to 26b are not caught by terminals 101 to 103, and lower contact end portions 24b to 26b are not damaged.

When wiring board 100 is attached to IC socket 10, sheet member 51 is pushed up by wiring board 100, and upper electrodes 61a, 62a and 63a are pushed against lower contact end portions 24b 25b and 26b. Against that pushing forth, contact pins 24 to 26 press lower contact end portions 24b 25b and 26b against upper electrodes 61a, 62a and 63a with the pressing force thereof. In this manner, lower contact end portions 24b 25b and 26b and upper electrodes 61a, 62a and 63a are reliably electrically connected.

At this time, sheet member 51 is sandwiched between contact pins 24 and 25 and terminals 101 and 102 overlapping each other in plan view via upper electrodes 61a and 62a and lower electrodes 61b and 62b overlapping each other in plan view.

For example, in FIG. 7A, sheet member 51 is sandwiched between contact pin 25 and terminal 101 overlapping each other in plan view via upper electrode 62a and lower electrode 61b overlapping each other in plan view and not electrically connected with each other. In this manner, lower contact end portion 25b and upper electrode 62a and lower electrode 61b and terminal 101 are reliably electrically connected. Note that in this case, upper electrode 62a is disposed at a position overlapping terminal 101 in plan view, and serves as an electrode (a non-connection upper electrode in the present invention) that is not electrically connected to terminal 101 of the overlapping position. When there is contact pin 25 that is not used for electrical connection, the contact pin 25 may function as a pressing pin that presses lower electrode 61b to terminal 101 with its pressing function via upper electrode 62a.

Sheet member 51 provided with first wiring 61, second wiring 62 and third wiring 63 desirably has flexibility that allows for individual displacement of first wiring 61 and second wiring 62 and third wiring 63. A flexible printed circuit (hereinafter referred to as FPC) is favorable as sheet member 51, for example. As illustrated in FIG. 7B, sheet member 51 may be composed of a plurality of stacked FPCs 51-1 to 51-4.

In the case where sheet member 51 has flexibility, first wiring 61, second wiring 62 and third wiring 63 can individually displace in the vertical direction in accordance with the contact state between lower contact end portions 24b, 26b and terminals 101 to 103. Even if the thicknesses of terminals 101 to 103 are uneven in the vertical thickness in wiring board 100, first wiring 61, second wiring 62 and third wiring 63 can individually displace in the vertical direction in accordance with the contact state of terminals 101 to 103. In this manner, contact pins 24 to 26 and terminals 101 to 103 can be reliably electrically connected by preventing poor contact between contact pins 24 to 26 and terminals 101 to 103.

In addition, sheet member 51 provided with fastening hole 64a corresponding to fastening hole 28 of base part 20 and fastening hole 33 of frame part 30, and positioning hole corresponding to the positioning hole of base part 20.

In addition, sheet member 51 is provided with insertion hole 66a to which guide member 71 is inserted. Insertion holes 66a are provided at four corners of sheet member 51, and are disposed on the center side than fastening hole 64a and positioning hole 65a in sheet member 51.

In the present embodiment, as an example, sheet member 51 includes protruding part 51a as four corners protruding outward, and third wiring 63, fastening hole 64a, positioning hole 65a, and insertion hole 66a are provided in protruding part 51a. The arrangement of third wiring 63, fastening hole 64a, positioning hole 65a, and insertion hole 66a may be appropriately changed as long as the electrical connection of first wiring 61 and second wiring 62 are not affected, and the shape of sheet member 51 may also be appropriately changed.

Bonding Member

Bonding member 52 is a member for bonding sheet member 51 to holding member 53, and a double-sided tape and the like can be used as an example. Bonding member 52 includes openings 52a and 52b corresponding to portions where first wiring 61, second wiring 62 and third wiring 63 are disposed. With openings 52a and 52b, the upper side of first wiring 61, second wiring 62 and third wiring 63 are exposed to lower contact end portions 24b to 26b side of contact pins 24 to 26.

In addition, bonding member 52 is also provided with fastening hole 64b corresponding to fastening hole 33 of frame part 30 and fastening hole 28 of base part 20, and positioning hole 65b corresponding to the positioning hole of base part 20. In addition, bonding member 52 is also provided with insertion hole 66b for inserting guide member 71 as in sheet member 51.

Except in openings 52a and 52b, bonding member 52 has substantially the same shape as sheet member 51, and the shape of bonding member 52 may be appropriately changed as long as sheet member 51 can be bonded to holding member 53.

Note that in the present embodiment, for example, sheet member 51 may be welded to holding member 53 by ultrasound welding and the like without using bonding member 52, or sheet member 51 may be fastened to holding member 53 by using a fastening member such as a screw. In short, sheet member 51 need only be firmly fixed to holding member 53 with a tensile force without being peeled off or removed from holding member 53 or being deflected.

Holding Member

Holding member 53 is a member for holding sheet member 51. It is preferably composed of metal or the like with a predetermined strength (rigidity) relative to sheet member 51 with flexibility, for example. Holding member 53 includes openings 53a and 53b corresponding to portions where first wiring 61, second wiring 62 and third wiring 63 are disposed. With openings 53a and 53b, first wiring 61, second wiring 62 and third wiring 63 are exposed to lower contact end portions 24b to 26b side of contact pins 24 to 26.

Holding member 53 has a large vertical thickness, with outer part 20d of base part 20 with a small vertical thickness as described above. Although a preload from wiring board 100 and a tensile force are applied to sheet member 51, the large vertical thickness can ensure the strength (rigidity) of holding member 53 and prevent deformation of holding member 53. In this manner, the tensile force applied to sheet member 51 can be maintained, and in addition, even when a preload is applied from wiring board 100 to sheet member 51, holding member 53 less deforms. In this manner, holding member 53 can hold sheet member 51 so as to suppress displacement of sheet member 51 in the direction perpendicular to the vertical direction.

In addition, holding member 53 is also provided with fastening hole 64c corresponding to fastening hole 33 of frame part 30 and fastening hole 28 of base part 20, and positioning hole 65c corresponding to the positioning hole of base part 20. Fastening hole 64a, fastening hole 64b and fastening hole 64c make up fastening hole 64, and positioning hole 65a, positioning hole 65b and positioning hole 65c make up positioning hole 65.

In addition, holding member 53 is also provided with insertion hole 66c for inserting guide member 71 as in sheet member 51. Insertion hole 66a, insertion hole 66b and insertion hole 66c make up insertion hole 66.

In insertion hole 66c, reduced diameter hole part 66c1 whose diameter is reduced on bottom surface 20b side of base part 20 is formed as illustrated in FIGS. 3 and 4. Reduced diameter hole part 66c1 is regulated by lower increased diameter part 71c of guide member 71 described later, and thus the downward movement of holding member 53, i.e., the downward movement of sheet member 51 is regulated.

Holding member 53 also has substantially the same shape as sheet member 51 except in openings 53a and 53b, and the shape of holding member 53 may be appropriately changed as long as sheet member 51 can be held.

In addition, holding member 53 may be integrated with base part 20. In the case where holding member 53 and base part 20 are integrated with each other, the bottom surface of holding member 53 may be set as bottom surface 20b of base part 20.

Guide Member

Guide member 71 for guiding supporting part 50 in a movable manner in the vertical direction is described below with reference to FIGS. 3 and 4.

As described above, holding member 53 of supporting part 50 includes insertion hole 66c to which guide member 71 is inserted, and reduced diameter hole part 66c1 whose diameter is reduced on bottom surface 20b side of base part 20 is formed in insertion hole 66c as illustrated in FIGS. 3 and 4.

Guide member 71 is inserted to insertion hole 66c having the above-described configuration, and screw fixed to screw fixing hole 29 of base part 20. With guide member 71 screw fixed to screw fixing hole 29, supporting part 50 provided with sheet member 51 is supported by base part 20 in the state where it faces bottom surface 20b.

Guide member 71 includes screw fixing body 71a, upper increased diameter part 71b, lower increased diameter part 71c, and outer peripheral surface 71d.

Screw fixing body 71a on the upper end side is screw fixed to screw fixing hole 29. The diameter of upper increased diameter part 71b is increased from screw fixing body 71a. The diameter of lower increased diameter part 71c on the lower end side is increased from upper increased diameter part 71b. Outer peripheral surface 71d along the vertical direction is disposed between upper increased diameter part 71b and lower increased diameter part 71c.

When guide member 71 is screw fixed to screw fixing hole 29, the top surface of upper increased diameter part 71b makes contact with bottom surface 20b of base part 20, and the position of lower increased diameter part 71c with respect to bottom surface 20b is set. The downward movement of the bottom surface of reduced diameter hole part 66c1 of insertion hole 66c is regulated by the top surface of lower increased diameter part 71c. That is, lower increased diameter part 71c is disposed at the guide lower end of guide member 71.

Thus, reduced diameter hole part 66c1 can move in the vertical direction between bottom surface 20b and the top surface of lower increased diameter part 71c. When reduced diameter hole part 66c1 moves in the vertical direction, it moves along outer peripheral surface 71d extending along the vertical direction, and as such supporting part 50 provided with sheet member 51 moves in the vertical direction with the guide of guide member 71.

Wiring Board Attach

As illustrated in FIG. 3, in a state before wiring board 100 is attached to IC socket 10, wiring board 100 that pushes up supporting part 50 is not provided. Therefore, the bottom surface of reduced diameter hole part 66c1 is regulated by the top surface of lower increased diameter part 71c, and a predetermined gap G is formed between bottom surface 20b of base part 20 and top surface 53c of holding member 53.

In the state where gap G is formed, lower contact end portions 24b to 26b of contact pins 24 to 26 are separated from first wiring 61, second wiring 62 and third wiring 63 of sheet member 51 without making contact with them. That is, in this state, no preload is applied between contact pins 24 to 26 and first wiring 61, second wiring 62 and third wiring 63. Note that gap G is a gap with which contact pins 24 to 26 are not removed from through hole 21 to 23, e.g., upper contact end portions 24a to 26a are not located below top surface 20a. With such a gap G, contact pins 24 to 26 are prevented from being removed from through hole 21 to 23.

Then, when wiring board 100 is attached to IC socket 10, the state after wiring board 100 is attached to IC socket 10 is set as illustrated in FIG. 4. In this state, terminals 101 to 103 of wiring board 100 make contact with the lower end of first wiring 61, second wiring 62 and third wiring 63 of sheet member 51, and push up supporting part 50 together with sheet member 51. When supporting part 50 is pushed up, top surface 53c of holding member 53 makes contact with bottom surface 20b, and gap G between bottom surface 20b and top surface 53c is substantially eliminated.

In the state where gap G is substantially eliminated, lower contact end portions 24b to 26b of contact pins 24 to 26 are in contact with, and pushed up by, first wiring 61, second wiring 62 and third wiring 63 of sheet member 51. That is, in this state, a preload is applied between contact pins 24 to 26 and first wiring 61, second wiring 62 and third wiring 63.

In this manner, supporting part 50 provided with sheet member 51 is disposed in the state where it faces bottom surface 20b, and therefore lower contact end portions 24b to 26b of contact pins 24 to 26 exposed from bottom surface 20b of base part 20 are not exposed to the outside of IC socket 10. Thus, even when the position of wiring board 100 is shifted and the posture is tilted with respect to IC socket 10 when attaching wiring board 100 to IC socket 10, wiring board 100 does not damage lower contact end portions 24b to 26b.

In addition, in the process of attaching wiring board 100 to IC socket 10, first wiring 61, second wiring 62 and third wiring 63 of sheet member 51 guided in the movable state in the vertical direction with guide member 71 push up lower contact end portions 24b to 26b in the vertical direction. Thus, lower contact end portions 24b to 26b are not pushed up in the direction inclined with respect to the vertical direction, and lower contact end portions 24b to 26b are not bent or folded.

Configuration of 4-Layer Sheet Member

The arrangement of the layer structure, upper electrode, lower electrode, interlayer via, and wiring of sheet member 51 are described with reference to FIGS. 7B and 8. FIG. 8 is a plan view for describing a 4-layer substrate making up sheet member 51. Note that FIG. 8 illustrates a plan view as viewed from base part 20 side.

As illustrated in FIG. 7B, sheet member 51 is composed of stacked 4-layer FPCs 51-1 to 51-4. The upper electrode, lower electrode, interlayer via, and wiring of first wiring 61 and second wiring 62 are formed in each of FPC 51-1 to 51-4.

For example, as illustrated in FIGS. 7B and 8, upper electrodes 61a and 62a and interlayer vias 61c and 62c are formed in uppermost layer FPC 51-1. Interlayer vias 61c and 62c, wiring 61d, ground layer 62d, and interlayer vias 61e and 62e are formed in FPC 51-2 where FPC 51-1 is stacked on the top surface side. Interlayer vias 61e and 62e, wiring 61f, ground layer 62f and interlayer vias 61g and 62g are formed in FPC 51-3 where FPC 51-2 is stacked on the top surface side. Interlayer vias 61g and 62g and lower electrodes 61b and 62b are formed in lowermost layer FPC 51-4 where FPC 51-3 is stacked on the top surface side. In this manner, first wiring 61 and second wiring 62 are formed.

The arrangement of terminals 101 and 102 of wiring board 100 and the arrangement of terminals 201 and 202 of IC package 200 are different from each other. Therefore, the arrangement of lower electrodes 61b and 62b connected to terminals 101 and 102 and the arrangement of upper electrodes 61a and 62a connected to terminals 201 and 202 are also different from each other.

Specifically, in the example illustrated in FIG. 8, lower electrodes 61b and 62b connected to terminals 101 and 102 and upper electrodes 61a and 62a connected to terminals 201 and 202 have the same distance (pitch) between terminals. On the other hand, upper electrode 61a connected to lower electrode 61b is shifted to the left side by one pitch, and to the upper side by one pitch with respect to lower electrode 61b in FIG. 8.

In accordance with the arrangement of terminals 101 and 102 of wiring board 100 and the arrangement of terminals 201 and 202 of IC package 200, lower electrodes 61b and 62b and upper electrodes 61a and 62a are disposed in a shifted manner in plan view.

Even when lower electrode 61b and upper electrode 61a corresponding to each other are disposed in a shifted manner in plan view, lower electrode 61b and upper electrode 61a can be connected to each other with wirings 61d and 61f. Likewise, even when lower electrode 62b and upper electrode 62a corresponding to each other are disposed in a shifted manner in plan view, lower electrode 62b and upper electrode 62a can be connected to each other with ground layers 62d and 62f.

Since first wiring 61 is connected to contact pin 24 that transmits signals, it is desirable that wirings 61d and 61f making up first wiring 61 configured to be a microstrip line or strip line in the case where a radio frequency signal is transmitted.

Figure 9:
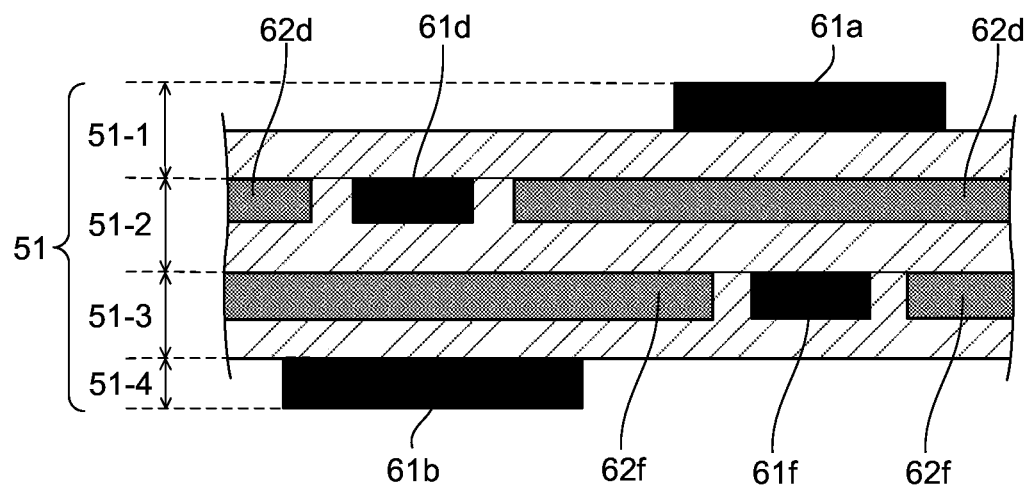
FIG. 9 is a sectional view for describing a case where a wiring of the sheet member illustrated in FIG. 8 is a microstrip line.
Figure 10:
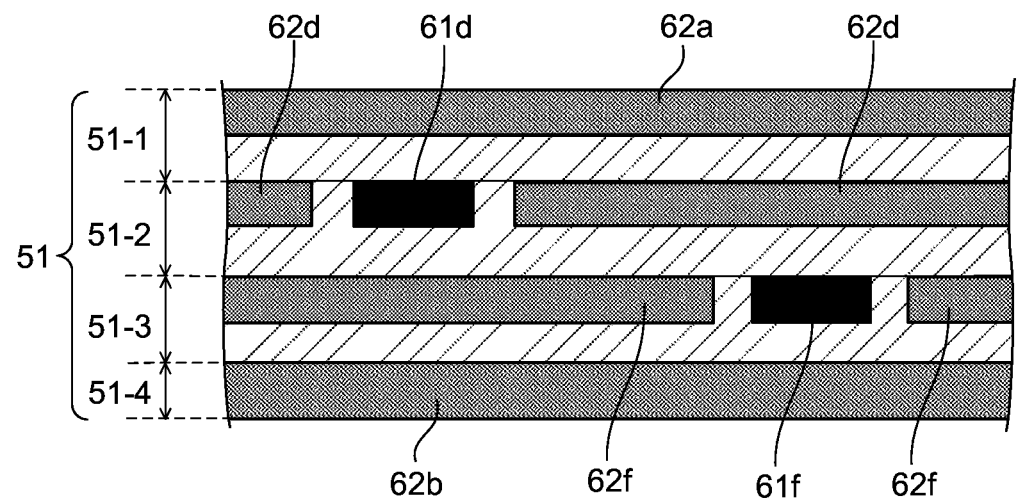
FIG. 10 is a sectional view for describing a case where the wiring of the sheet member illustrated in FIG. 8 is a strip line.

FIG. 9 is a sectional view for describing a case where wirings 61d and 61f making up first wiring 61 of sheet member 51 are microstrip lines. In addition, FIG. 10 is a sectional view for describing a case where wirings 61d and 61f making up first wiring 61 of sheet member 51 are strip lines. Note that in FIGS. 9 and 10, illustration of interlayer via is omitted.

As illustrated in FIG. 9, wiring 61d that transmits signals is formed in a sandwiched manner between the dielectric substrates of FPC 51-1 and FPC 51-2, and ground layer 62f is disposed on the lower direction side of wiring 61d with a predetermined distance therebetween. In addition, wiring 61f that transmits signals is formed in a sandwiched manner between the dielectric substrates of FPC 51-2 and FPC 51-3, and ground layer 62d is disposed on the upper direction side of wiring 61f with a predetermined distance therebetween. That is, wirings 61d and 61f has a configuration of a microstrip line of embedded type. With this configuration, the impedance can be set to a desired value.

In the case where the configuration of the strip line illustrated in FIG. 10 is provided, a ground layer serving also as an upper electrode 62a is formed in the region excluding upper electrode 61a in FPC 51-1 illustrated in FIG. 8. In addition, in FPC 51-4 illustrated in FIG. 8, a ground layer serving also as lower electrode 62b is formed in the region excluding lower electrode 61b.

As illustrated in FIG. 10, wiring 61d that transmits signals is formed in a sandwiched manner between the dielectric substrates of FPC 51-1 and FPC 51-2, and upper electrode 62a serving also as the ground layer and ground layer 62f are disposed with a predetermined distance from wiring 61d on both sides in the vertical direction. In addition, wiring 61f that transmits signals is formed in a sandwiched manner between the dielectric substrates of FPC 51-2 and FPC 51-3, and the ground layer 62d and lower electrode 62b serving also as the ground layer are disposed with a predetermined distance from wiring 61f on both sides in the vertical direction.

That is, wiring 61d has a configuration of a strip line sandwiched between upper electrode 62a and ground layer 62f in the vertical direction through the dielectric substrates of FPC 51-1 and FPC 51-2. In addition, wiring 61f has a configuration of a strip line sandwiched between lower electrode 62b and ground layer 62d in the vertical direction through the dielectric substrates of FPC 51-2 and FPC 51-3. With this configuration, the impedance can be set to a desired value.

Configuration of 2-Layer Sheet Member

Figure 11:
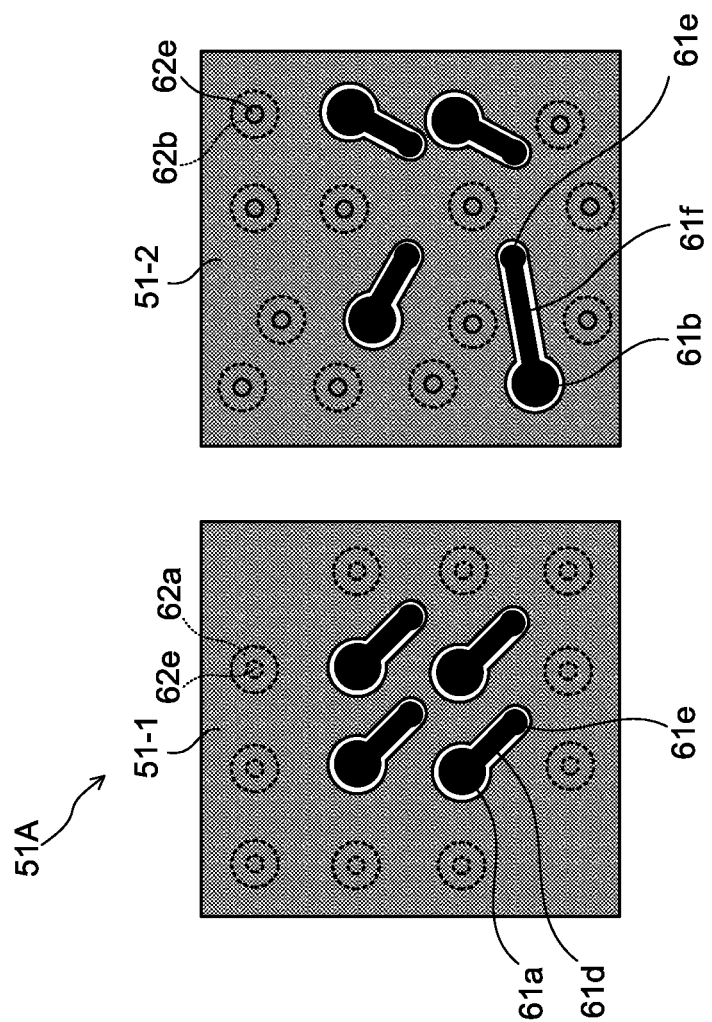
FIG. 11 is a plan view for describing a 2-layer substrate making up the sheet member.
Figure 12:
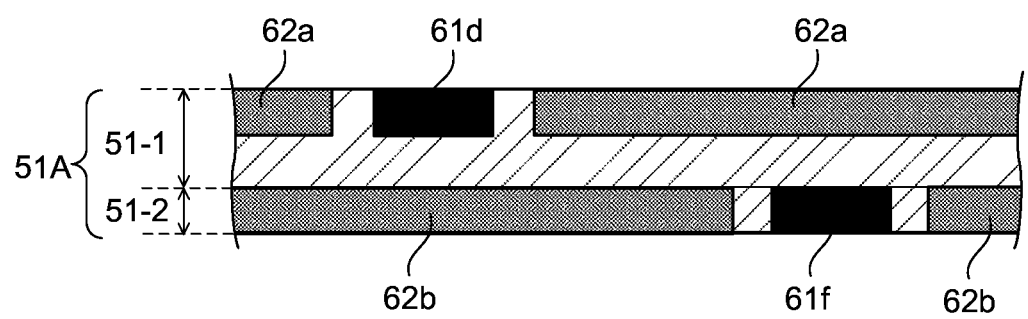
FIG. 12 is a sectional view for describing a case where a wiring of the sheet member illustrated in FIG. 11 is a microstrip line.

While FIGS. 8 to 10 and the like illustrate an example of sheet member 51 composed of 4-layer FPCs, sheet member 51A composed of 2-layer FPCs may also be used as illustrated in FIGS. 11 and 12.

FIG. 11 is a plan view for describing a 2-layer substrate making up sheet member 51A. FIG. 12 is a sectional view for describing a case where the wiring of sheet member 51A illustrated in FIG. 11 is a microstrip line. Note that FIG. 11 illustrates a plan view as viewed from base part 20 side. In addition, in FIG. 12, illustration of the interlayer via is omitted.

As illustrated in FIG. 11, sheet member 51A is composed of stacked 2-layer FPCs 51-1 and 51-2. The upper electrode, lower electrode, interlayer via, and wiring of wiring 61 and second wiring 62 are formed in each of FPC 51-1 and 51-2.

For example, as illustrated in FIG. 11, in uppermost layer FPC 51-1, upper electrode 61a, wiring 61d, and interlayer via 61e are formed, and upper electrode 62a and interlayer via 62e serving also as the ground layer are formed. In lowermost layer FPC 51-2 where FPC 51-1 is stacked on the top surface side, lower electrode 61b, interlayer via 61e and wiring 61f are formed, and lower electrode 62b and interlayer via 62e serving also as the ground layer are formed. In this manner, first wiring 61 and second wiring 62 are formed. Note that unlike sheet member 51 illustrated in FIG. 8, the number of layers of sheet member 51A illustrated in FIG. 11 is small, and therefore interlayer vias 61c, 62c, 61g and 62g and ground layers 62d and 62f illustrated in FIG. 8 may be omitted.

The arrangement of terminals 101 and 102 of wiring board 100 and the arrangement of terminals 201 and 202 of IC package 200 are different from each other. Therefore, in the example illustrated in FIG. 11, lower electrodes 61b and 62b connected to terminals 101 and 102 and upper electrodes 61a and 62a connected to terminals 201 and 202 differ in distance between terminals, and in shifting direction of terminals.

Lower electrode 61b and upper electrode 61a are disposed in a shifted manner in plan view in accordance with the arrangement of terminal 101 of wiring board 100 and the arrangement of terminal 201 of IC package 200. Note that lower electrode 62b corresponding to terminal 102 of wiring board 100 is served by the ground layer formed in the region excluding lower electrode 61b, interlayer via 61e and wiring 61f. Likewise, upper electrode 62a corresponding to terminal 101 of wiring board 100 is served by the ground layer formed in the region excluding upper electrode 61a, wiring 61d, and interlayer via 61e.

Even when lower electrode 61b and upper electrode 61a corresponding to each other are disposed in a shifted manner in plan view, lower electrode 61b and upper electrode 61a can be connected by wirings 61d and 61f.

Note that as described above, lower electrode 62b is served by the ground layer formed in the region excluding lower electrode 61b, interlayer via 61e and wiring 61f, and upper electrode 62a is served by the ground layer formed in the region excluding upper electrode 61a, wiring 61d and interlayer via 61e. Thus, even when lower electrode 62b and upper electrode 62a corresponding to each other are disposed in a shifted manner in plan view, lower electrode 62b and upper electrode 62a can be connected by the ground layer.

In the case where a radio frequency signal is transmitted in sheet member 51A, wirings 61d and 61f making up first wiring 61 connected to contact pin 24 are desirably configured to be microstrip lines.

As illustrated in FIG. 12, wiring 61d that transmits signals is formed on the top surface side of the dielectric substrate of FPC 51-1, and lower electrode 62b serving also as the ground layer is disposed on the lower direction side of wiring 61d with a predetermined distance therebetween through the dielectric substrate of FPC 51-1.

In addition, wiring 61f that transmits signals is formed on the bottom surface side of the dielectric substrate of FPC 51-2, and upper electrode 62a serving also as the ground layer is disposed on the upper direction side of wiring 61f with a predetermined distance therebetween through the dielectric substrate of FPC 51-1. Wirings 61d and 61f have a configuration of microstrip line, and with this configuration, the impedance can be set to a desired value.

Configuration of 3-Layer Sheet Member

Figure 13:
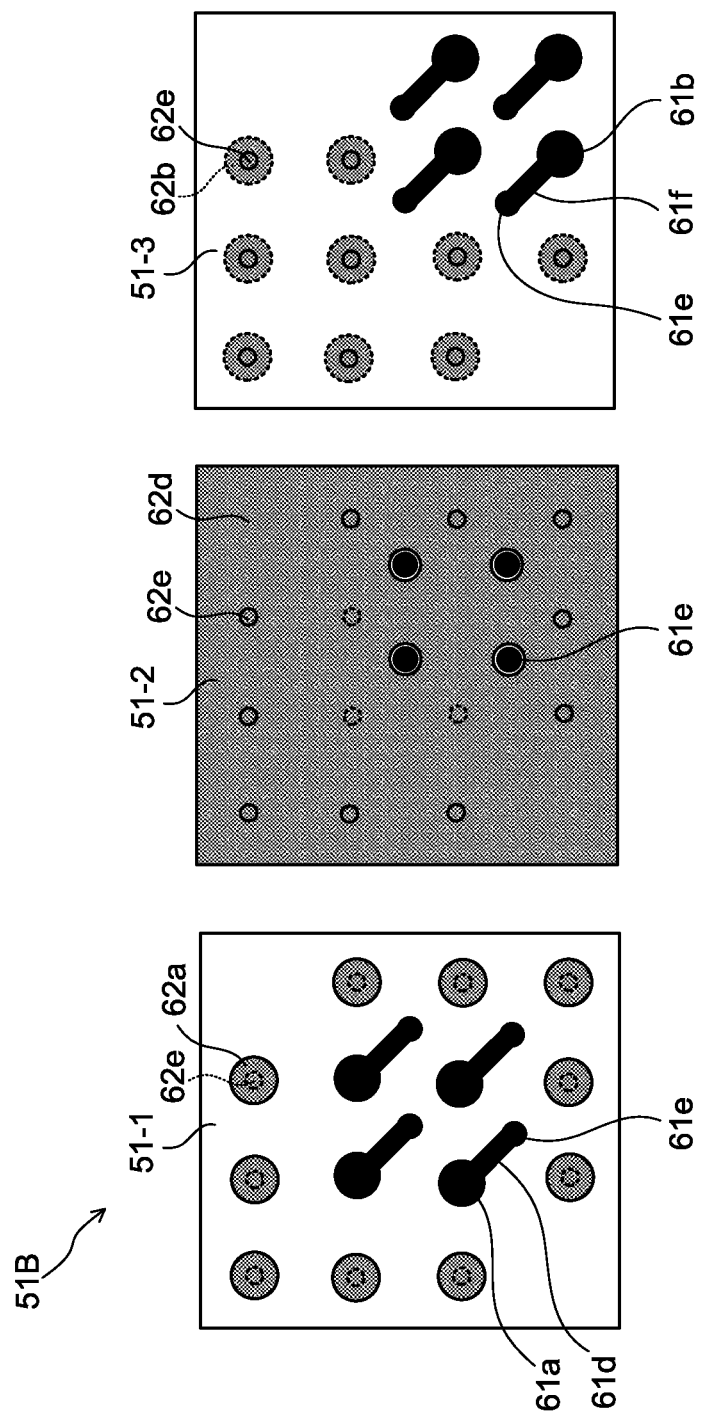
FIG. 13 is a plan view for describing a 3-layer substrate making up the sheet member.
Figure 14:
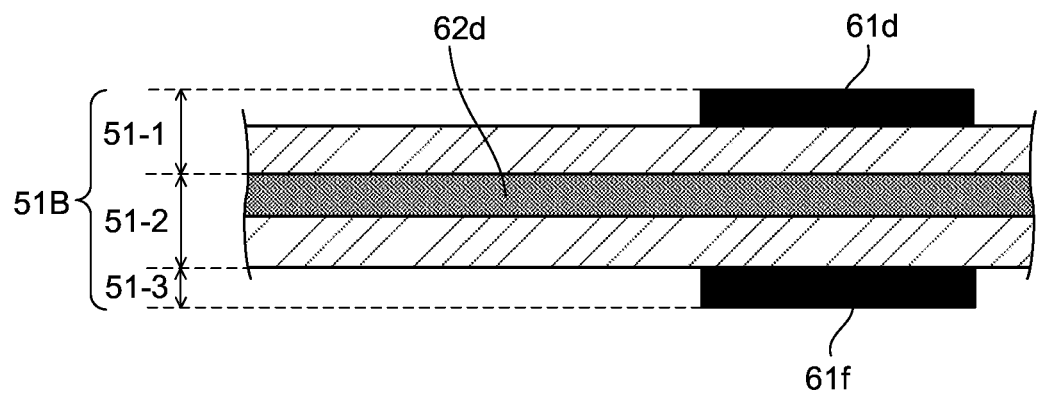
FIG. 14 is a sectional view for describing a case where the wiring of the sheet member illustrated in FIG. 13 is a microstrip line.
Figure 15:
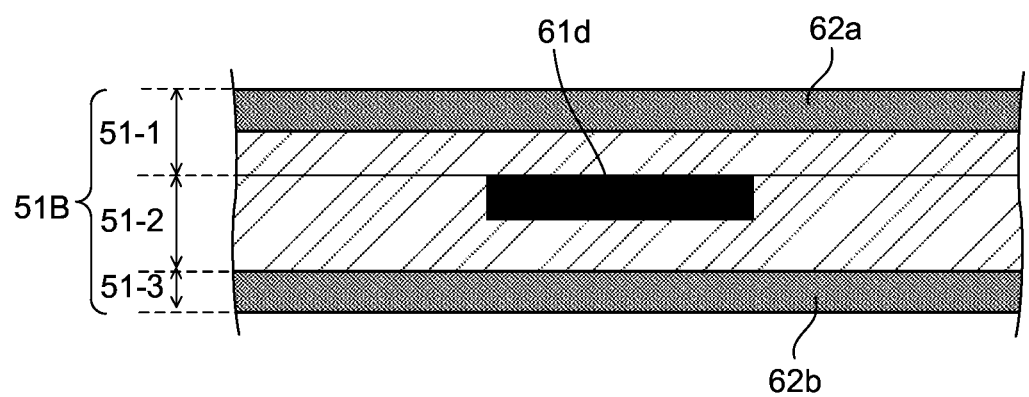
FIG. 15 is a sectional view for describing a case where the wiring of the sheet member illustrated in FIG. 13 is a strip line.

While FIGS. 8 to 10 and the like illustrate an example of sheet member 51 composed of 4-layer FPCs, and FIGS. 11 and 12 illustrate an example of sheet member 51A composed of 2-layer FPCs, sheet member 51B composed of a 3-layer FPC may be provided as illustrated in FIGS. 13 to 15.

FIG. 13 is a plan view for describing a 3-layer substrate making up sheet member 51B. FIG. 14 is a sectional view for describing a case where the wiring of sheet member 51B illustrated in FIG. 13 is a microstrip line. FIG. 15 is a sectional view for describing a case where the wiring of sheet member 51B illustrated in FIG. 13 is a strip line. Note that FIG. 13 illustrates a plan view as viewed from base part 20 side. In addition, in FIGS. 14 and 15, illustration of the interlayer via is omitted.

As illustrated in FIG. 13, sheet member 51B is composed of stacked 3-layer FPCs 51-1 to 51-3. The upper electrode, lower electrode, interlayer via, and wiring of first wiring 61 and second wiring 62 are formed in each of FPCs 51-1 to 51-3.

For example, as illustrated in FIG. 13, upper electrodes 61a and 62a, wiring 61d, and interlayer vias 61e and 62e are formed in uppermost layer FPC 51-1. Ground layer 62d and interlayer vias 61e and 62e are formed in FPC 51-2 where FPC 51-1 is stacked on the top surface side. Interlayer vias 61e and 62e, wiring 61f and lower electrodes 61b and 62b are formed in lowermost layer FPC 51-3 where FPC 51-2 is stacked on the top surface side. In this manner, first wiring 61 and second wiring 62 are formed. Note that unlike sheet member 51 illustrated in FIG. 8, the number of layers of sheet member 51B illustrated in FIG. 13 is small, and therefore interlayer vias 61c, 62c, 61g and 62g and ground layer 62d illustrated in FIG. 8 may be omitted.

The arrangement of terminals 101 and 102 of wiring board 100 and the arrangement of terminals 201 and 202 of IC package 200 are different from each other. Therefore, the arrangement of lower electrodes 61b and 62b connected to terminals 101 and 102 and the arrangement of upper electrodes 61a and 62a connected to terminals 201 and 202 are also different from each other.

Specifically, in the example illustrated in FIG. 13, lower electrodes 61b and 62b connected to terminals 101 and 102 and upper electrodes 61a and 62a connected to terminals 201 and 202 have the same distance (pitch) between terminals. On the other hand, upper electrode 61a connected to lower electrode 61b is shifted to the left side by one pitch and to the upper side by one pitch with respect to lower electrode 61b in FIG. 13.

Lower electrodes 61b and 62b and upper electrodes 61a and 62a are disposed in a shifted manner in plan view in accordance with the arrangement of terminals 101 and 102 of wiring board 100 and the arrangement of terminals 201 and 202 of IC package 200.

Even when lower electrode 61b and upper electrode 61a corresponding to each other are disposed in a shifted manner in plan view, lower electrode 61b and upper electrode 61a can be connected by wirings 61d and 61f.

Note that lower electrode 62b corresponding to terminal 102 of wiring board 100 and upper electrode 62a corresponding to terminal 202 of IC package 200 are connected to common ground layer 62d through interlayer via 62e. Therefore, lower electrode 62b and upper electrode 62a disposed at any positions are connected to each other.

In sheet member 51B, when transmitting a radio frequency signal, wirings 61d and 61f making up first wiring 61 connected to contact pin 24 are desirably have a configuration of microstrip line or strip line.

As illustrated in FIG. 14, wiring 61d that transmits signals is formed on the top surface side of the dielectric substrate of FPC 51-1, and ground layer 62d is disposed on the lower direction side of wiring 61d with a predetermined distance therebetween through the dielectric substrate of FPC 51-1.

In addition, wiring 61f that transmits signals is formed on the bottom surface side of the dielectric substrate of FPC 51-2, and ground layer 62d is disposed on the upper direction side of wiring 61f with a predetermined distance therebetween through the dielectric substrate of FPC 51-2. Wirings 61d and 61f have a configuration of microstrip line, and with this configuration, the impedance can be set to a desired value.

In the case where the configuration of the strip line illustrated in FIG. 15 is provided, a ground layer is formed in FPC 51-1 and FPC 51-3. In addition, a wiring corresponding to wiring 61d is formed in FPC 51-2. At this time, the ground layer serving also as upper electrode 62a is formed in the region excluding upper electrode 61a in FPC 51-1, and the ground layer serving also as lower electrode 62b is formed in the region excluding lower electrode 61b in FPC 51-3.

Further, as illustrated in FIG. 15, wiring 61d that transmits signals is formed in a sandwiched manner between the dielectric substrates of FPC 51-1 and FPC 51-2. In addition, upper electrode 62a serving also as the ground layer and lower electrode 62b serving also as the ground layer are disposed with a predetermined distance from wiring 61d on both sides in the vertical direction.

That is, wiring 61d has a configuration of a strip line sandwiched between upper electrode 62a and lower electrode 62b in the vertical direction through the dielectric substrates of FPC 51-1 and FPC 51-2. With this configuration, the impedance can be set to a desired value.

CONCLUSION

As described above, in the present embodiment, IC socket 10 includes base part 20 including through holes 21 and 22 with the same arrangement as terminals 201 and 202 of IC package 200, contact pins 24 and 25 inserted to through holes 21 and 22, and sheet member 51. Sheet member 51 is disposed at base part 20 in the state where it faces bottom surface 20b of base part 20, and includes first wiring 61 and second wiring 62.

First wiring 61 and second wiring 62 include upper electrodes 61a and 62a that make contact with contact pins 24 and 25 when used, lower electrodes 61b and 62b that make contact with terminals 101 and 102 when used, wirings 61d and 61f, and ground layers 62d and 62f. Wirings 61d and 61f and ground layers 62d and 62f extend in the direction that intersects the vertical direction from upper electrodes 61a and 62a to lower electrodes 61b and 62b, and connect upper electrodes 61a and 62a and lower electrodes 61b and 62b disposed at different positions in plan view.

According to the above-described configuration of the present embodiment, contact pins 24 and 25 and terminals 101 and 102 are connected by using sheet member 51 including first wiring 61 and second wiring 62 where upper electrodes 61a and 62a and lower electrodes 61b and 62b are connected in an offset manner. Thus, IC socket 10 including such a sheet member 51 can achieve electrical connection to IC package 200 differing from wiring board 100 in arrangement of the terminal.

Thus, when at least sheet member 51 and base part 20 corresponding to the arrangement of terminals 201 and 202 of IC package 200 of a different type are prepared for this IC package 200, it is not necessary to prepare additional expensive wiring board 100, and thus cost can be reduced.

In addition, in the case where a radio frequency signal is transmitted, a configuration of a microstrip line or a strip line is provided to wirings 61d and 61f of first wiring 61 of sheet member 51. In this manner, even when electrical connection to IC package 200 differing from wiring board 100 in arrangement of the terminal is made, degradation in signal characteristics can be minimized.

Modification 1

Figure 16A:
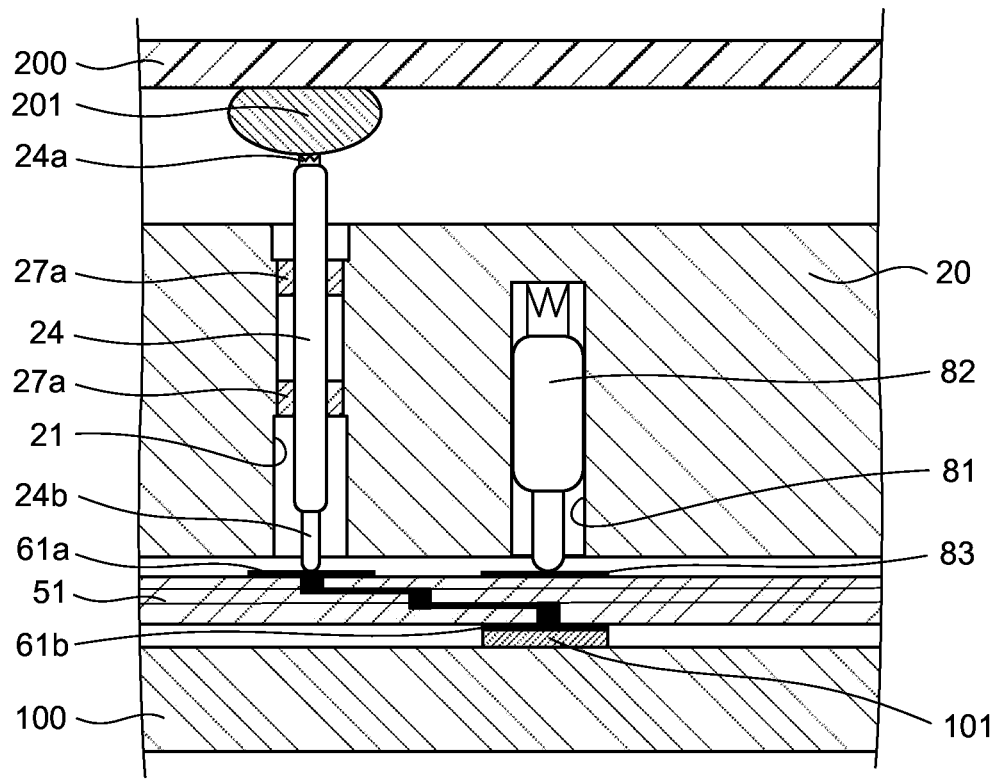
FIG. 16A is a sectional view for describing a configuration of pressing the sheet member in Modification 1.
Figure 16B:
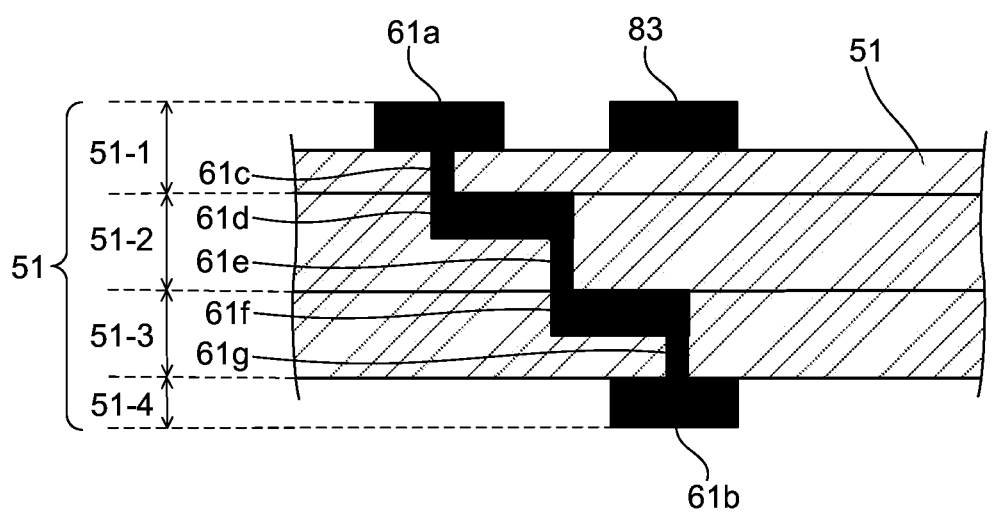
FIG. 16B is a plan view illustrating the sheet member illustrated in FIG. 16A in an enlarged manner.

FIG. 16A is a sectional view for describing a configuration of pressing sheet member 51 of the present modification. In addition, FIG. 16B is a plan view illustrating sheet member 51 illustrated in FIG. 16A in an enlarged manner.

In the above-described embodiment, sheet member 51 is pressed to wiring board 100 side by using contact pin 25, but pressing pin 82 (a pressing member in the present invention) that is not used for electrical connection may also be used as illustrated in FIG. 16A.

In this case, dummy electrode 83 (a protrusion in the present invention) not used for electrical connection is disposed at sheet member 51 on the upper side of sheet member 51 at a position overlapping terminal 101 of wiring board 100 in plan view. Specifically, as illustrated in FIG. 16B, dummy electrode 83 is formed in uppermost layer FPC 51-1 together with upper electrode 61a and interlayer via 61c, and dummy electrode 83 is disposed at the top surface of FPC 51-1 together with upper electrode 61a. Dummy electrode 83 and other electrodes such as lower electrode 61b (or lower electrode 62b) are not electrically connected with each other.

Note that dummy electrode 83 is provided at a position overlapping terminal 101 of wiring board 100 in plan view here, but dummy electrode 83 may be provided at a position overlapping terminal 102 of wiring board 100 in plan view. In addition, dummy electrode 83 is composed of the same as metal as that of upper electrodes 61a and 62a since dummy electrode 83 is pressed by pressing pin 82, but it may be composed of a member with a rigidity higher than that of the base material of sheet member 51 as long as a protrusion protruding toward pressing pin 82 can be formed.

Recess 81 opening toward dummy electrode 83 and configured to house pressing pin 82 is provided in base part 20, and pressing pin 82 is inserted to recess 81 to house pressing pin 82 in recess 81.

With this configuration, when IC socket 10 is used, pressing pin 82 presses dummy electrode 83 to press lower electrode 61b (or lower electrode 62b) to terminal 101 (or terminal 102) via dummy electrode 83.

In this manner, sheet member 51 is sandwiched between pressing pin 82 and terminal 101 (or terminal 102) overlapping each other in plan view via dummy electrode 83 and lower electrode 61b (or lower electrode 62b) overlapping each other in plan view. In this manner, lower electrode 61b (or lower electrode 62b) and terminal 101 (or terminal 102) are reliably electrically connected.

Modification 2

Figure 17:
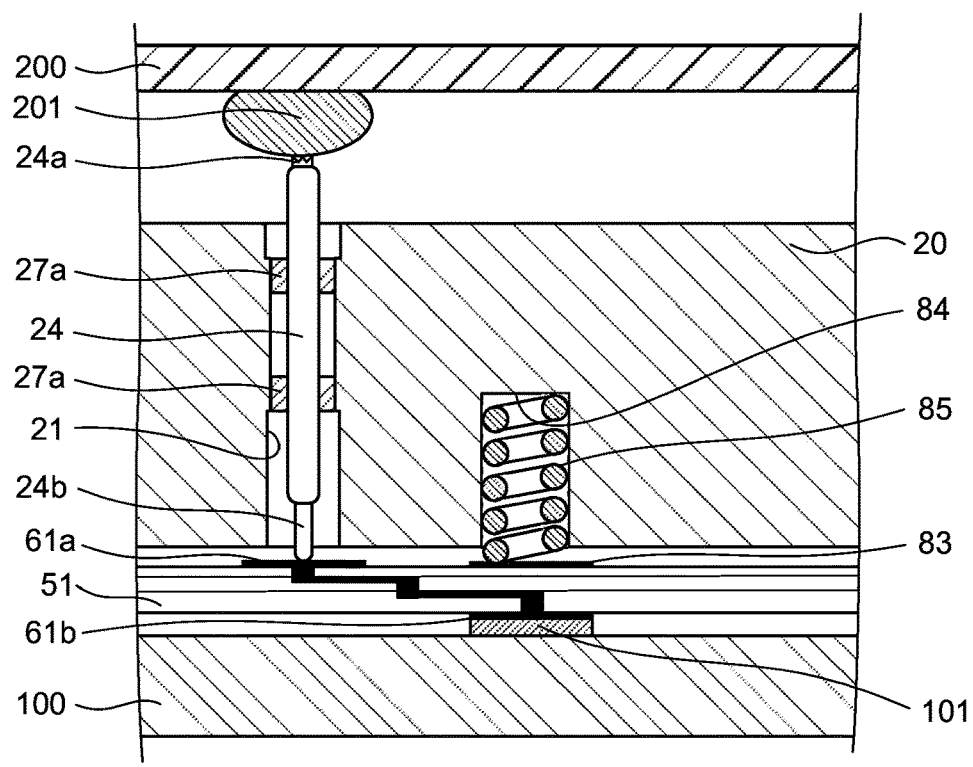
FIG. 17 is a sectional view for describing a configuration of pressing the sheet member in Modification 2.

FIG. 17 is a sectional view for describing a configuration of pressing sheet member 51 of the present modification.

While sheet member 51 is pressed to wiring board 100 side by using contact pin 25 and pressing pin 82 in the present embodiment and Modification 1, elastic member 85 such as a coil spring (a pressing member in the present invention) may also be used as illustrated in FIG. 17.

Also in the present modification, as in Modification 1, dummy electrode 83 not used for electrical connection is disposed at sheet member 51 on the upper side of sheet member 51 at a position overlapping terminal 101 of wiring board 100 (or terminal 102) in plan view.

Further, recess 84 opening toward dummy electrode 83 and configured to house elastic member 85 is provided in base part 20, and elastic member 85 is inserted to recess 84 to house elastic member 85 in recess 84. As illustrated in FIG. 17, a coil spring or an elastically-deformable member such as rubber may be used for elastic member 85.

With this configuration, when IC socket 10 is used, elastic member 85 presses dummy electrode 83 to press lower electrode 61b (or lower electrode 62b) to terminal 101 (or terminal 102) via dummy electrode 83.

In this manner, sheet member 51 is sandwiched between elastic member 85 and terminal 101 (or terminal 102) overlapping each other in plan view via dummy electrode 83 and lower electrode 61b (or lower electrode 62b) overlapping each other in plan view. In this manner, lower electrode 61b (or lower electrode 62b) and terminal 101 (or terminal 102) are reliably electrically connected.

Modification 3

Figure 18:
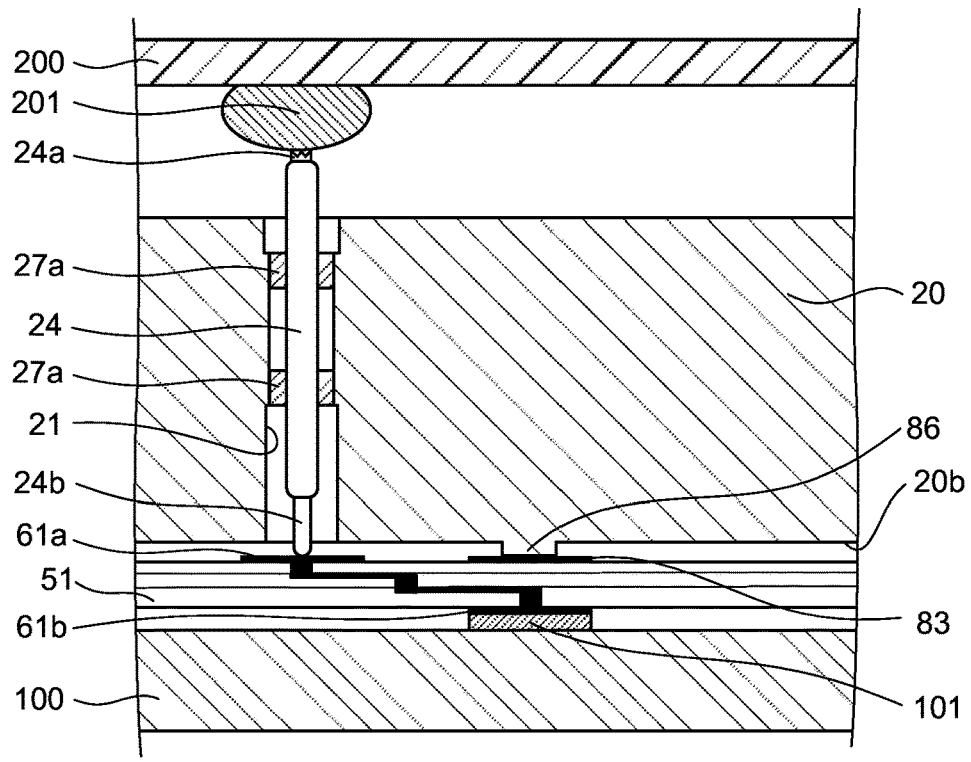
FIG. 18 is a sectional view for describing a configuration of pressing the sheet member in Modification 3.

FIG. 18 is a sectional view for describing a configuration of pressing sheet member 51 of the present modification.

While sheet member 51 is pressed to wiring board 100 side by using contact pin 25 and pressing pin 82 in the present embodiment and in Modification 1, and by using elastic member 85 in Modification 2, protruding part 86 provided in base part 20 may also be used as illustrated in FIG. 18.

Also in the present modification, as in Modifications 1 and 2, dummy electrode 83 not used for electrical connection is disposed at sheet member 51 on the upper side of sheet member 51 at a position overlapping terminal 101 (or terminal 102) of wiring board 100 in plan view.

Further, protruding part 86 protruding toward dummy electrode 83 is provided in bottom surface 20b of base part 20. Protruding part 86 may be formed by processing base part 20 itself such that it protrudes from bottom surface 20b toward dummy electrode 83, or may be formed as a member separated from base part 20 and attached to bottom surface 20b such that it protrudes toward dummy electrode 83. In the case where protruding part 86 is formed as a member separated from base part 20, an elastically-deformable elastic member such as rubber may also be used for protruding part 86, for example.

When wiring board 100 is attached to IC socket 10 when IC socket 10 is used, sheet member 51 is pushed up together with supporting part 50. With this external upward pushing force, a pressure force is generated between protruding part 86 and terminal 101 (or terminal 102). In this manner, protruding part 86 presses dummy electrode 83, and presses lower electrode 61b (or lower electrode 62b) against terminal 101 (or terminal 102) via dummy electrode 83. That is, protruding part 86 functions as a pressing member of the present invention.

In this manner, sheet member 51 is sandwiched between protruding part 86 and terminal 101 (or terminal 102) overlapping each other in plan view through dummy electrode 83 and lower electrode 61b (or lower electrode 62b) overlapping each other in plan view. In this manner, lower electrode 61b (or lower electrode 62b) and terminal 101 (or terminal 102) are reliably electrically connected.

Note that in the present modification, dummy electrode 83 may be formed with a thickness with which bottom surface 20b of base part 20 can be pressed without forming protruding part 86 in base part 20.

Other Modifications

In the present embodiment, in the process of attaching wiring board 100 to IC socket wiring board 100 pushes up sheet member 51 such that the above-described gap G is substantially eliminated. Conversely, before attaching wiring board 100 to IC socket 10, supporting part 50 may be attached to bottom surface 20b of base part 20 such that gap G is substantially eliminated. For example, in place of guide member 71, it is possible to use a fastening member for attaching supporting part 50 to bottom surface 20b such as gap G is substantially eliminated. In addition, base part 20 and holding member 53 may be integrated with each other, and guide member 71 may be omitted.

In addition, in place of supporting part 50, it is possible to use sheet member 51 alone. For example, sheet member 51 may be attached alone to bottom surface 20b of base part 20 such that gap G is substantially eliminated through an attaching method such as bonding, welding and fastening.

The above forms are merely examples of embodiments for implementing the invention, and the technical scope of the invention should not be interpreted as limited by them. In other words, the invention can be implemented in various forms without departing from its gist or its main features.

INDUSTRIAL APPLICABILITY

The socket and the inspection socket according to the embodiment of the present invention are suitable for an IC socket for housing an electric component such as an IC package on wiring board, for example.

REFERENCE SIGNS LIST

10 IC socket
20 Base part
20a Top surface
20b Bottom surface
21, 22, 23 Through hole
24, 25, 26 Contact pin
24a, 25a, 26a Upper contact end portion
24b, 25b, 26b Lower contact end portion
27a, 27b Insulating member
28 Fastening hole
29 Screw fixing hole
30 Frame part
31 Guide part
32 Positioning pin
33 Fastening hole
40 Housing part
50 Supporting part
51 Sheet member
51a Protruding part
52 Bonding member
52a, 52b Opening
53 Holding member
53a, 53b Opening
53c Top surface
61 First wiring
62 Second wiring
63 Third wiring
64, 64a, 64b, 64c Fastening hole
65a, 65b, 65c Positioning hole
66, 66a, 66b, 66c Insertion hole
66c1 Reduced diameter hole part
71 Guide member
71a Screw fixing body
71b Upper increased diameter part
71c Lower increased diameter part
71d Outer peripheral surface
81, 84 Recess
82 Pressing pin
83 Dummy electrode
85 Elastic member
86 Protruding part
100 Wiring board
101 to 103 Terminal
104 Fastening hole
200 IC Package
201, 202 Terminal

What is claimed is:

1. A socket configured to electrically connect a first electric component including a first terminal and a second electric component including a second terminal that is different from the first terminal in arrangement, the socket comprising:
   a contact pin configured to electrically connect the first terminal and the second terminal;
   a base part where the contact pin is disposed; and
   a sheet member disposed to face a surface of the base part on a second electric component side, the sheet member including an upper electrode configured to make contact with the contact pin when in use, a lower electrode configured to make contact with the second terminal when in use, and a wiring configured to connect the upper electrode and the lower electrode disposed at different positions in plan view,
   wherein the sheet member includes a protrusion disposed on an upper side of the sheet member at a position overlapping the second terminal in plan view;
   the base part includes a pressing member housed in a recess opening toward the protrusion, the pressing member being configured to press the protrusion when in use; and
   the pressing member presses the lower electrode to the second terminal via the protrusion.

2. The socket according to claim 1,
   wherein the protrusion is a member with a rigidity higher than a rigidity of a base material of the sheet member; and
   the pressing member is a pressing pin configured to press the protrusion.

* * * * *